(12) United States Patent
Weng et al.

(10) Patent No.: US 11,251,191 B2
(45) Date of Patent: Feb. 15, 2022

(54) THREE-DIMENSIONAL MEMORY DEVICE CONTAINING MULTIPLE SIZE DRAIN CONTACT VIA STRUCTURES AND METHOD OF MAKING SAME

(71) Applicant: SANDISK TECHNOLOGIES LLC, Addison, TX (US)

(72) Inventors: Lishan Weng, Milpitas, CA (US); Fumiaki Toyama, Cupertino, CA (US); Mohan Dunga, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 23 days.

(21) Appl. No.: 16/231,760

(22) Filed: Dec. 24, 2018

(65) Prior Publication Data

US 2020/0203365 A1 Jun. 25, 2020

(51) Int. Cl.
| | |
|---|---|
| *H01L 27/11582* | (2017.01) |
| *H01L 27/11573* | (2017.01) |
| *H01L 27/11565* | (2017.01) |
| *H01L 21/768* | (2006.01) |
| *H01L 27/1157* | (2017.01) |

(52) U.S. Cl.
CPC .. *H01L 27/11582* (2013.01); *H01L 21/76805* (2013.01); *H01L 21/76843* (2013.01); *H01L 21/76877* (2013.01); *H01L 27/1157* (2013.01); *H01L 27/11565* (2013.01); *H01L 27/11573* (2013.01)

(58) Field of Classification Search
None
See application file for complete search history.

(56) References Cited

U.S. PATENT DOCUMENTS

| | | | |
|---|---|---|---|
| 9,484,296 B2 | 11/2016 | Takahashi et al. | |
| 9,613,795 B2 | 4/2017 | Huang et al. | |
| 9,899,399 B2 | 2/2018 | Ogawa et al. | |
| 10,050,054 B2* | 8/2018 | Zhang | H01L 27/11565 |
| 10,355,015 B2* | 7/2019 | Zhang | G11C 16/08 |
| 10,373,969 B2* | 8/2019 | Zhang | H01L 27/1157 |
| 2010/0213526 A1* | 8/2010 | Wada | H01L 27/11578 |
| | | | 257/314 |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

*Primary Examiner* — Abul Kalam
(74) *Attorney, Agent, or Firm* — The Marbury Law Group PLLC

(57) ABSTRACT

A three-dimensional memory device includes an alternating stack of insulating layers and electrically conductive layers located over a substrate, memory stack structures extending through the alternating stack, where each of the memory stack structures contains a respective memory film and a respective vertical semiconductor channel, drain regions contacting an upper end of a respective one of the vertical semiconductor channels, first contact via structures directly contacting a first subset of the drain regions and each having a first horizontal cross-sectional area, and second contact via structures directly contacting a second subset of the drain regions and each having a second horizontal cross-sectional area that is greater than the first horizontal cross-sectional area.

20 Claims, 31 Drawing Sheets

(56) References Cited

U.S. PATENT DOCUMENTS

| | | | |
|---|---|---|---|
| 2010/0244119 A1* | 9/2010 | Fukuzumi | H01L 29/66833 257/324 |
| 2015/0054058 A1* | 2/2015 | Seol | H01L 29/42332 257/324 |
| 2015/0318298 A1* | 11/2015 | Matsudaira | H01L 27/11582 257/314 |
| 2016/0056210 A1* | 2/2016 | Takaki | H01L 27/249 257/5 |
| 2016/0240476 A1 | 8/2016 | Takahashi et al. | |
| 2016/0293621 A1 | 10/2016 | Huang et al. | |
| 2017/0125433 A1 | 5/2017 | Ogawa et al. | |
| 2017/0278571 A1* | 9/2017 | Chowdhury | G11C 16/0483 |

* cited by examiner

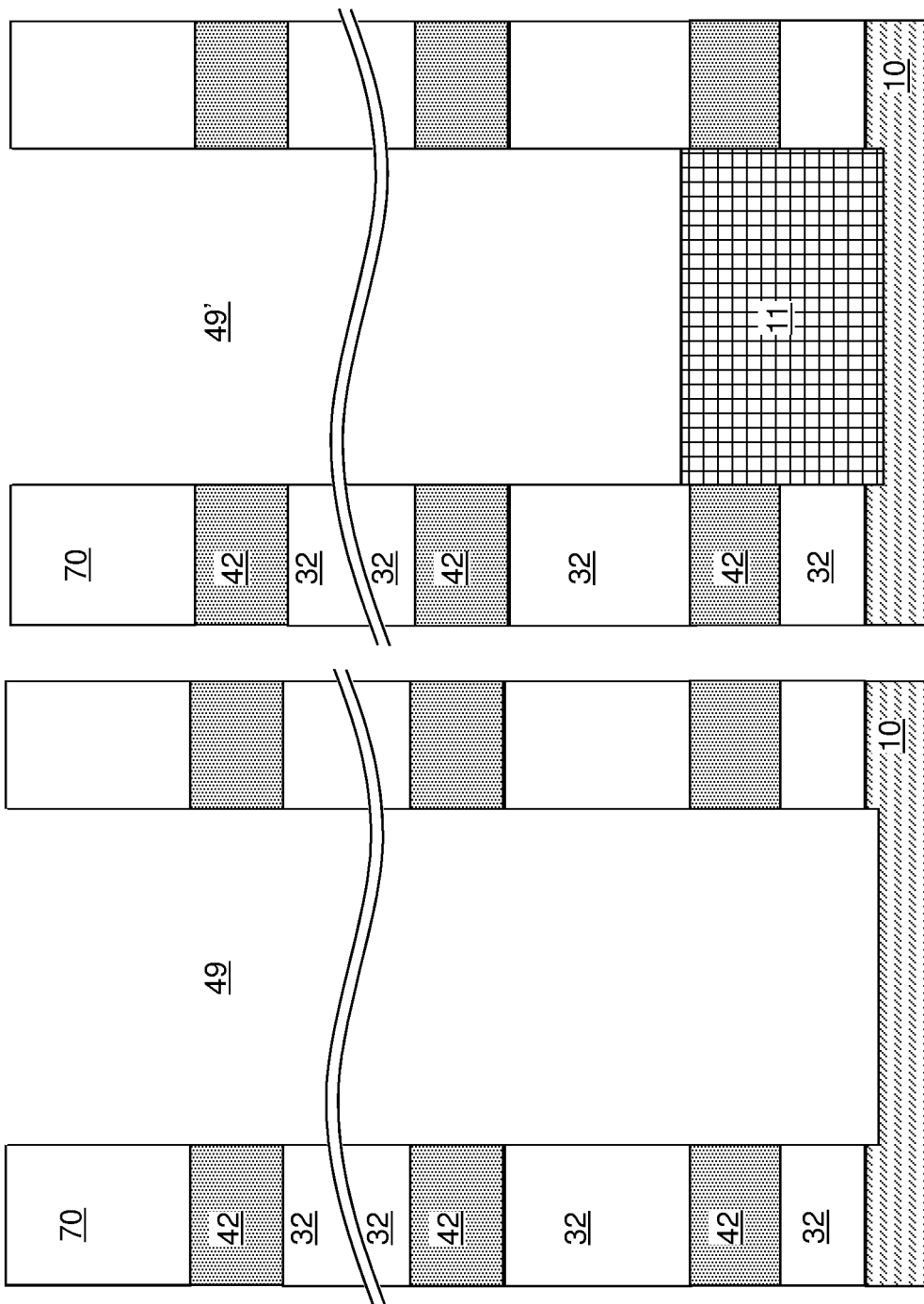

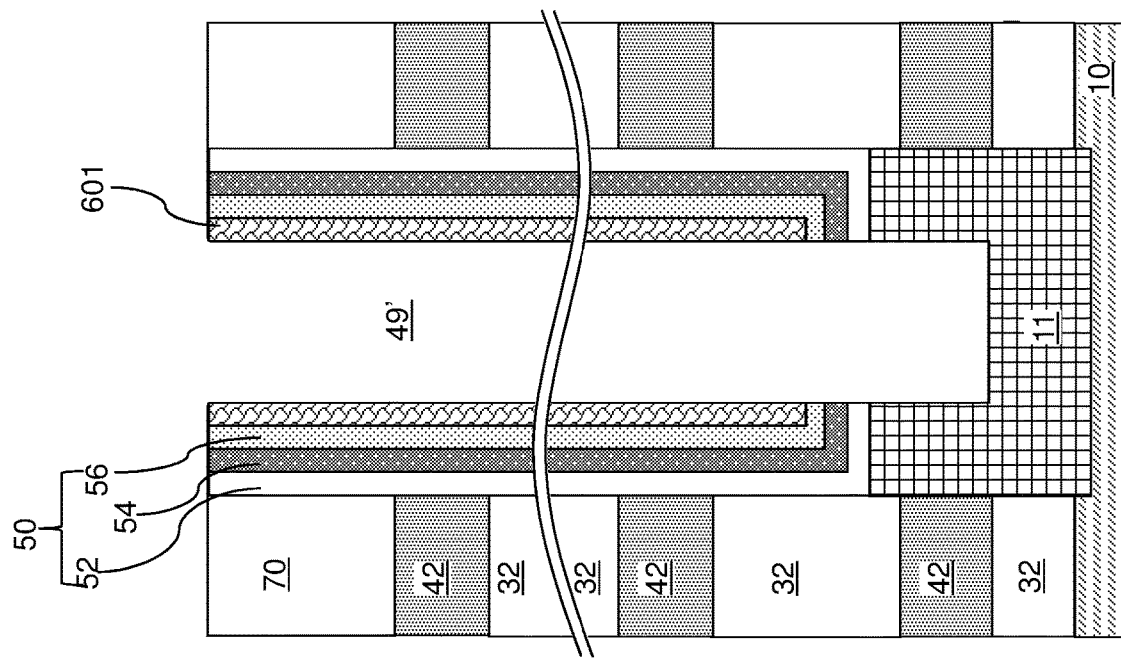
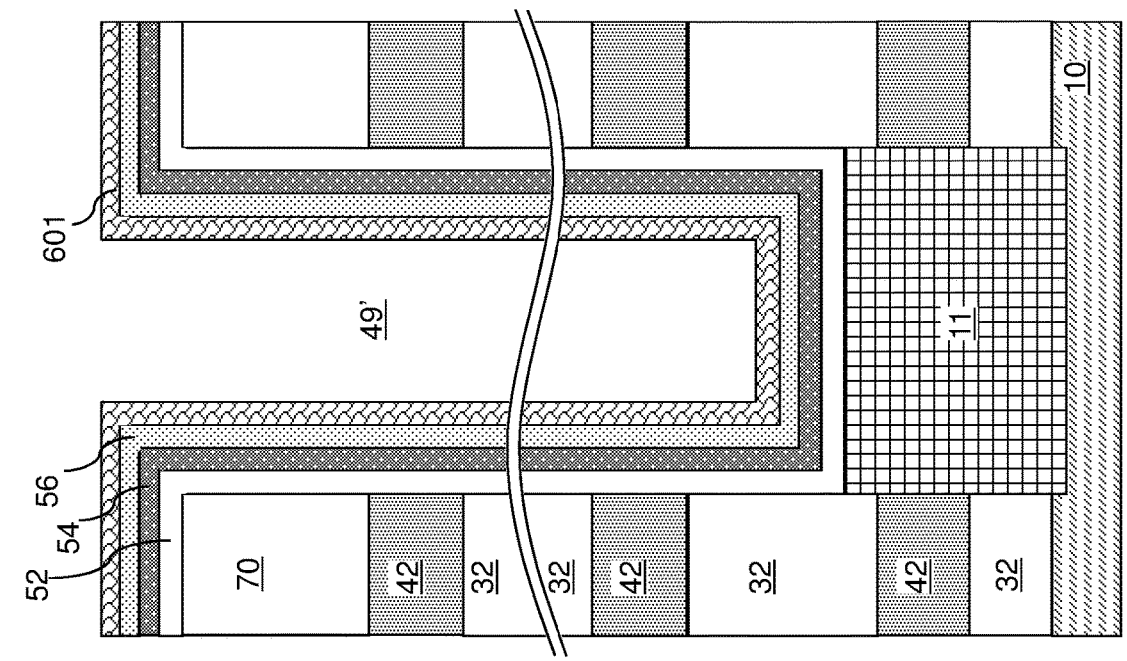

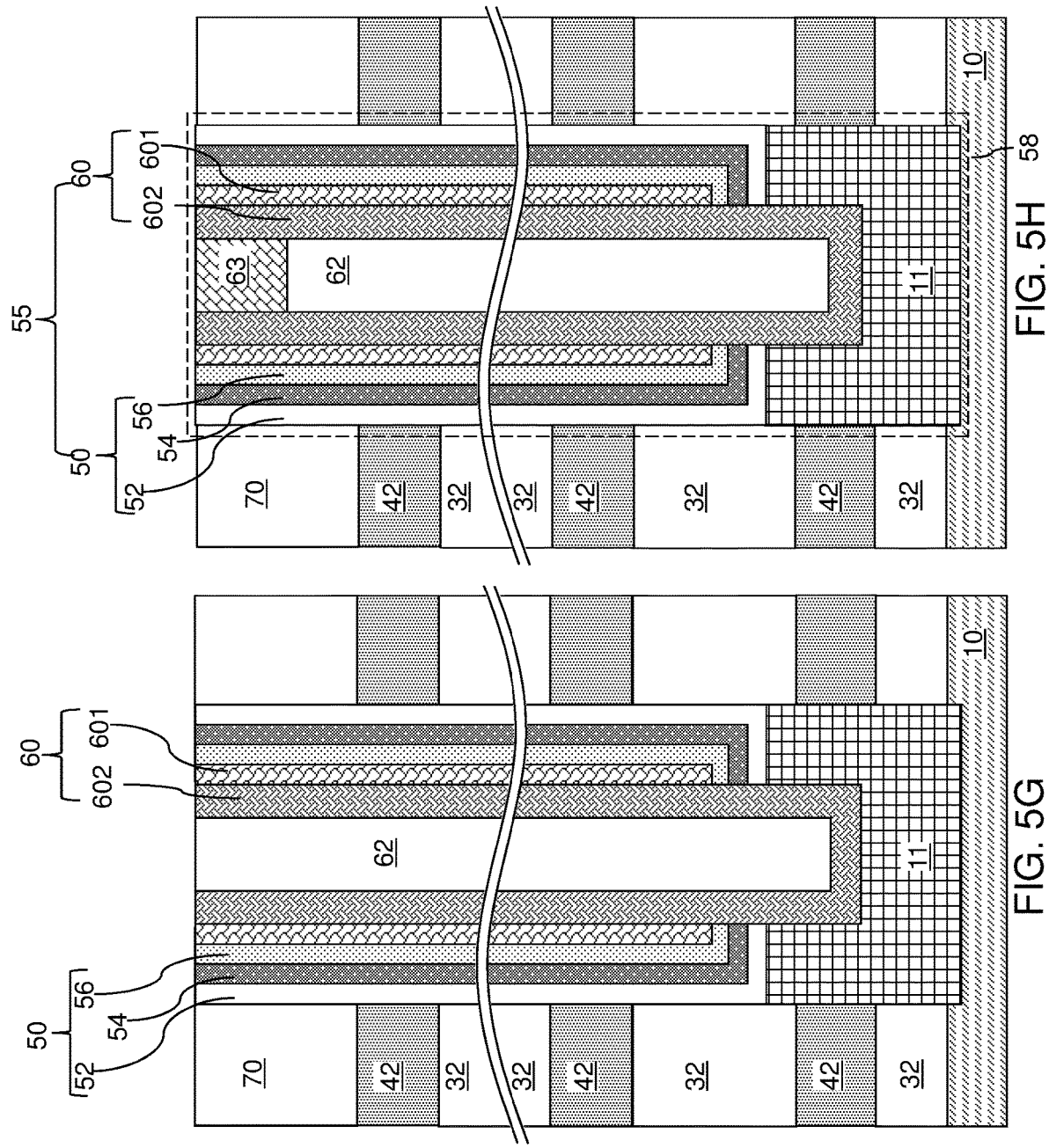

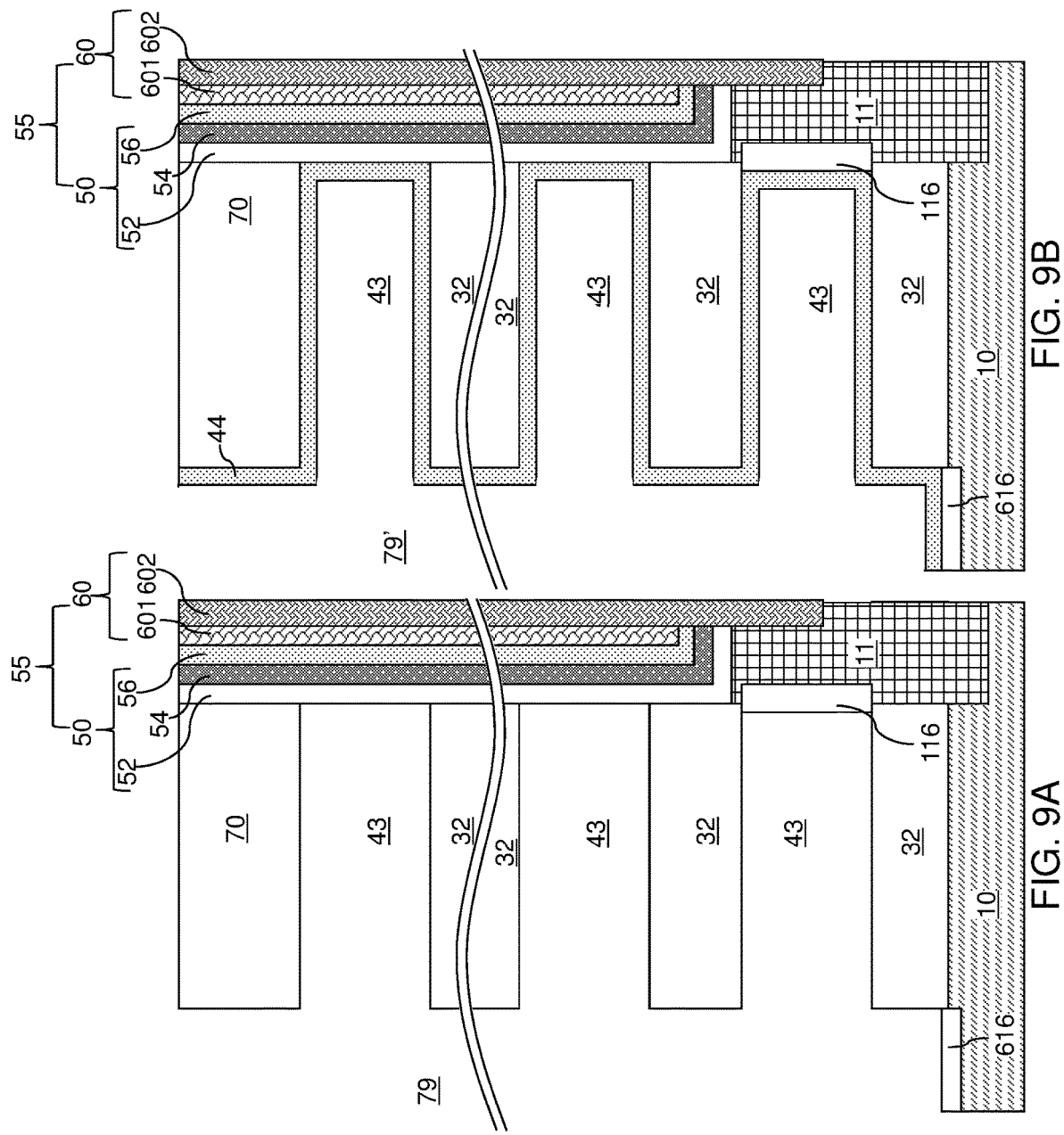

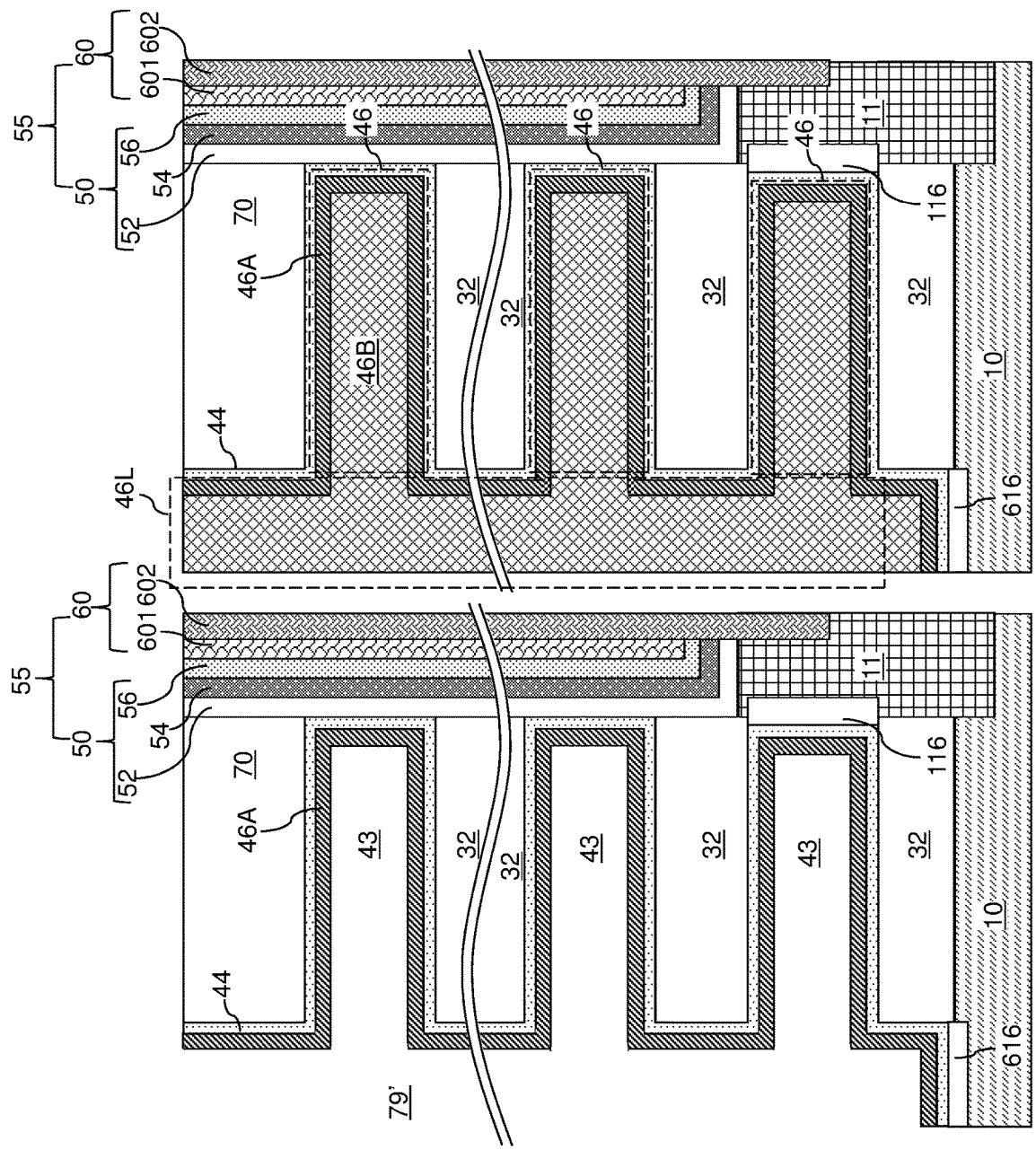

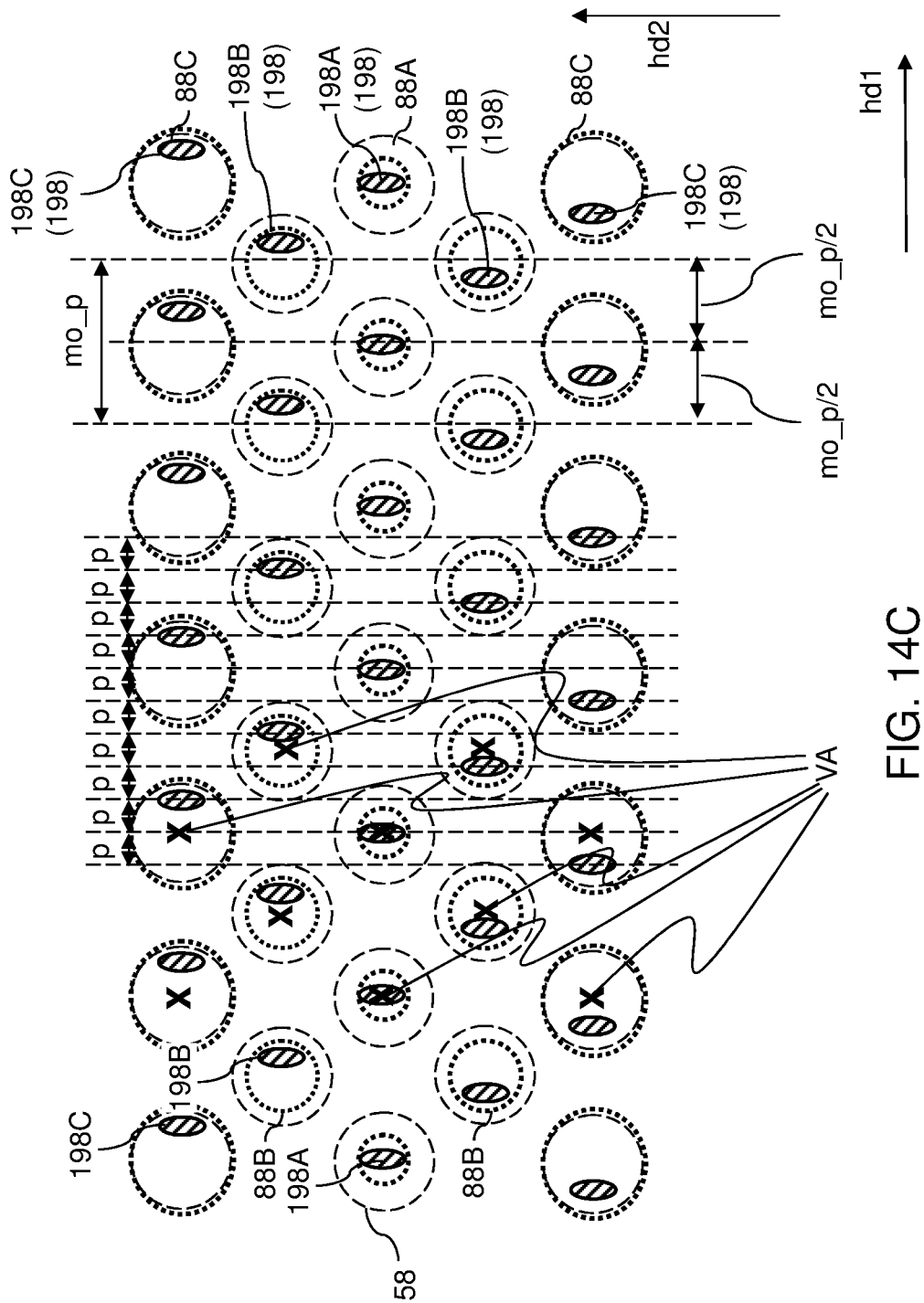

THREE-DIMENSIONAL MEMORY DEVICE CONTAINING MULTIPLE SIZE DRAIN CONTACT VIA STRUCTURES AND METHOD OF MAKING SAME

FIELD

The present disclosure relates generally to the field of semiconductor devices, and particular to a three-dimensional memory device using multiple size drain contact via structures and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate; memory stack structures extending through the alternating stack, wherein each of the memory stack structures comprises a respective memory film and a respective vertical semiconductor channel; drain regions contacting an upper end of a respective one of the vertical semiconductor channels; first contact via structures directly contacting a first subset of the drain regions and each having a first horizontal cross-sectional area; and second contact via structures directly contacting a second subset of the drain regions and each having a second horizontal cross-sectional area that is greater than the first horizontal cross-sectional area.

According to another embodiment of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming memory stack structures through the alternating stack, wherein each of the memory stack structures comprises a respective memory film and a respective vertical semiconductor channel; forming drain regions on an upper end of a respective one of the vertical semiconductor channels; forming contact via structures on the drain regions, wherein the contact via structures comprise: first contact via structures formed directly on a first subset of the drain regions and each having a first horizontal cross-sectional area; and second contact via structures formed directly on a second subset of the drain regions and each having a second horizontal cross-sectional area that is greater than the first horizontal cross-sectional area.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 14C is a magnified view of a region in FIG. 14B.

DETAILED DESCRIPTION

Figure 1:
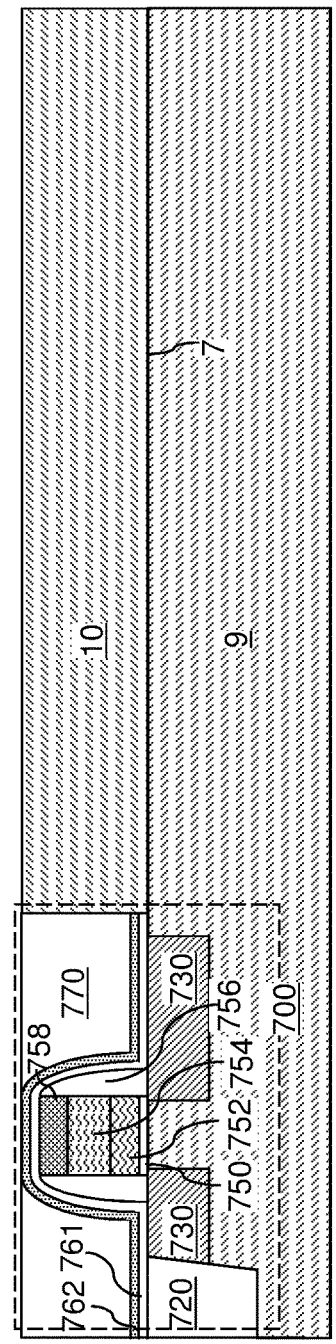
FIG. 1 is a schematic vertical cross-sectional view of an exemplary structure after formation of at least one peripheral device, and a semiconductor material layer according to an embodiment of the present disclosure.

The bit line pitch is typically the smallest pitch for the three-dimensional memory device, and benefits from precise alignment to underlying elongated via structures. The elongated via structures are connected to underlying drain regions of the three-dimensional vertical NAND strings through an array of drain contact structures that are larger than the elongated via structures. A larger size of the drain contact structures relative to the elongated via structures is necessary to accommodate passing of multiple bit lines over each drain region. However, the larger size of the drain contact structures reduces the separation distance between the drain contact structures, and increases the RC coupling between the drain contact structures. The RC coupling increases the response time for a sense circuitry that including the bit lines, the elongated via structures, and the drain contact structures, thereby limiting the operational frequency of the sense circuitry.

Embodiments of the present disclosure are directed to a three-dimensional memory device using multiple size drain contact via structures and methods of manufacturing the same, the various aspects of which are described below. In an embodiment, the different sized drain contain via structures enhancing the operational frequency of the sense circuitry while providing electrical connections between the respective drain regions and bit lines. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Referring to FIG. 1, an exemplary structure according to an embodiment of the present disclosure is illustrated, which may be used, for example, to fabricate a device structure containing vertical NAND memory devices. The exemplary structure includes a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device 700 for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate (9, 10). As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the semiconductor substrate layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 170 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200.

Figure 2:
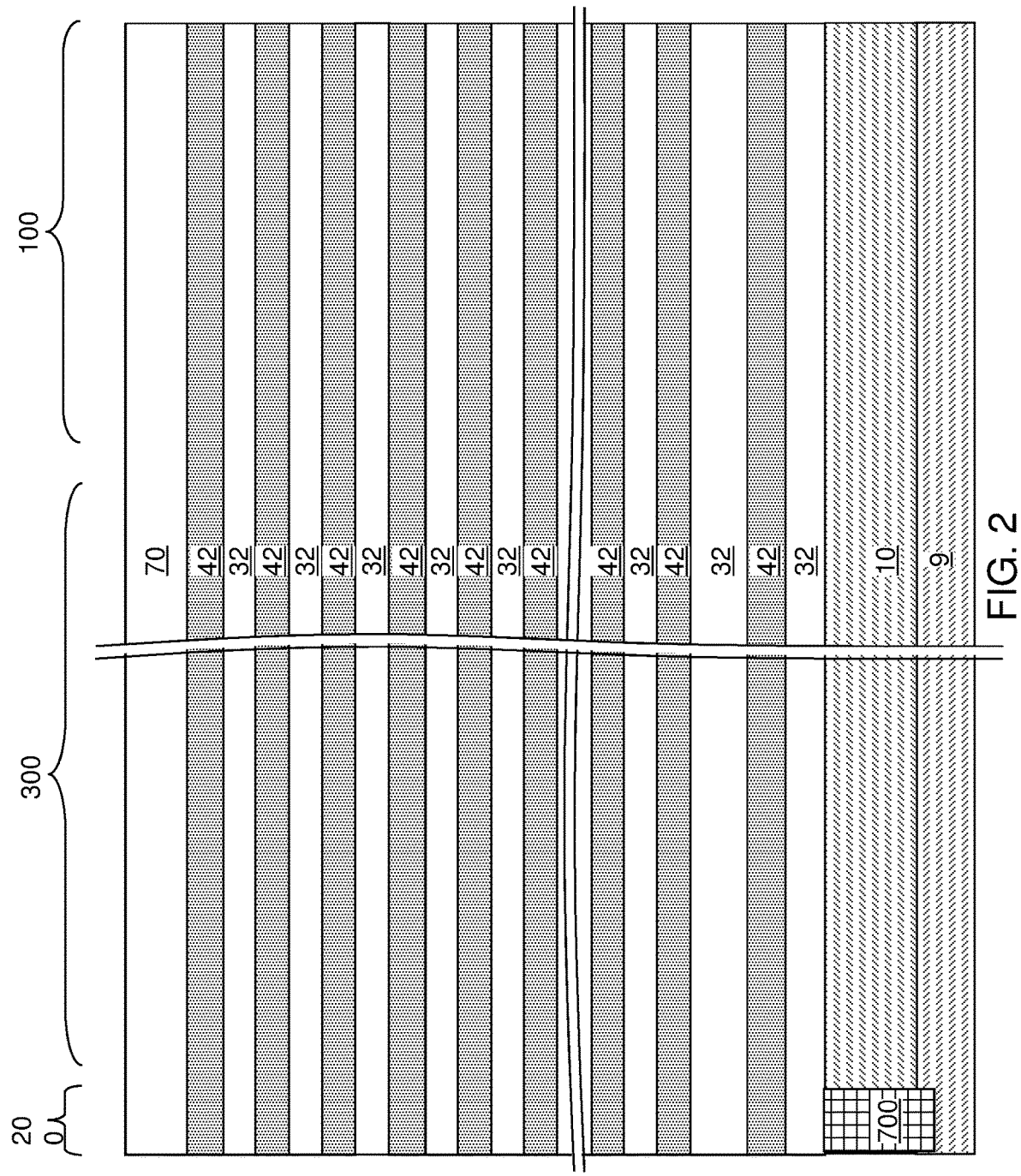
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device 700 for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets between the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
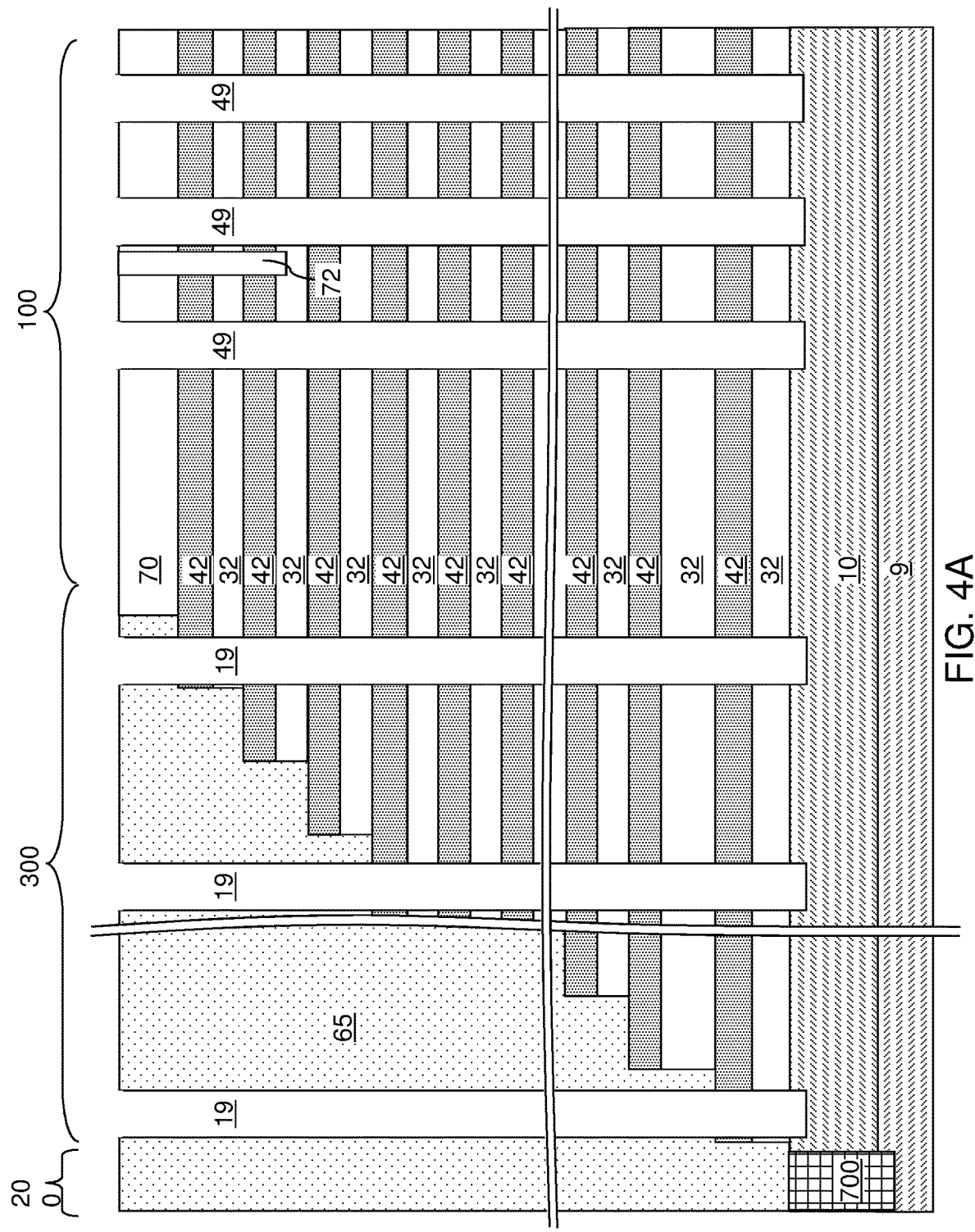
FIG. 4A is a schematic vertical cross-sectional view of the exemplary structure after formation of memory openings and support openings according to an embodiment of the present disclosure.
Figure 4B:
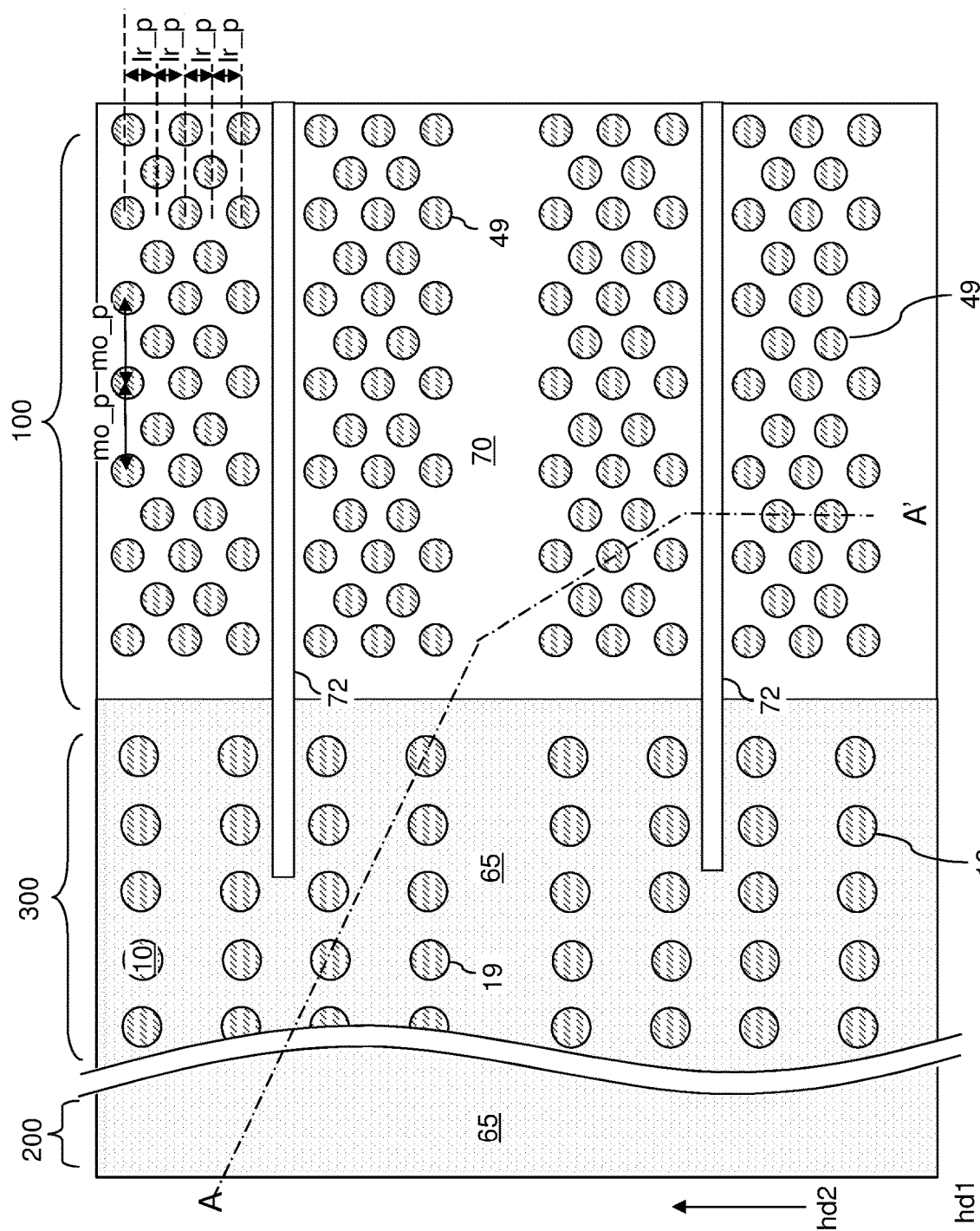
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

The memory openings 49 may be formed in rows that extend along a first horizontal direction hd1 that is perpendicular to the planes of the vertical steps of the stepped surfaces in the staircase region 300. In one embodiment, each row of memory openings 49 may comprise a one-dimensional periodic array of memory openings 49 having a uniform center-to-center distance between neighboring pairs of memory openings 49, which is herein referred to as a memory opening pitch mo_p. In one embodiment, five rows of memory openings 49 may be formed as a cluster arranged as a hexagonal two-dimensional periodic array. The rows of memory openings 49 within each cluster of rows of memory openings 49 may be laterally spaced apart with a uniform inter-row pitch ir_p along a second horizontal direction hd2 that is perpendicular to the first horizontal direction hd1. In one embodiment, the support openings 19 may be arranged in rows that extend along the first horizontal direction hd1.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In this case, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 5C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer 52 may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (e.g., the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Figure 5E:
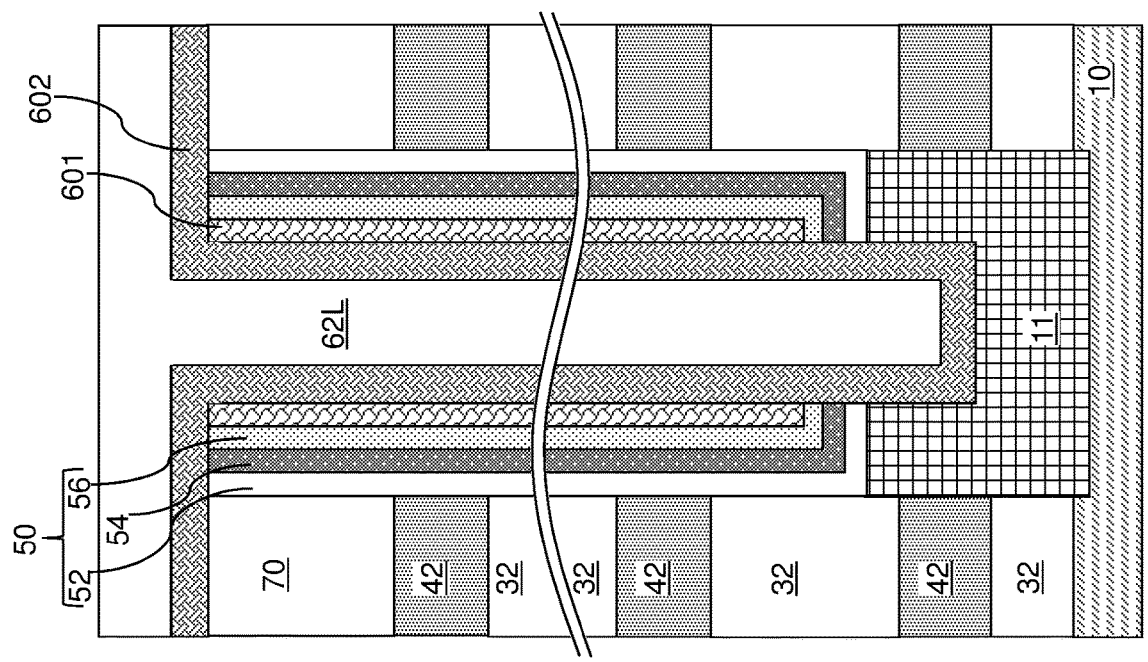

Referring to FIG. 5E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
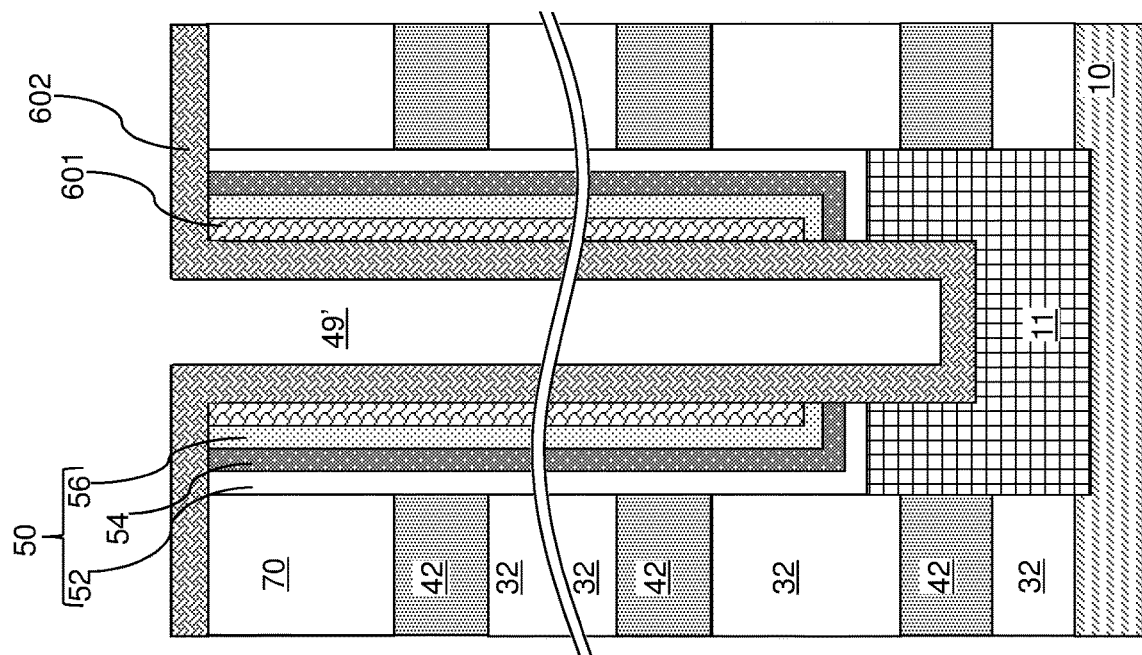

Referring to FIG. 5F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 5G, the horizontal portion of the dielectric core layer 62L may be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 may be removed by a planarization process, which may us a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 may be further recessed within each memory opening, for example, by a recess etch to a depth that is located between the top surface of the insulating cap layer 70 and the bottom surface of the insulating cap layer 70. Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6A:
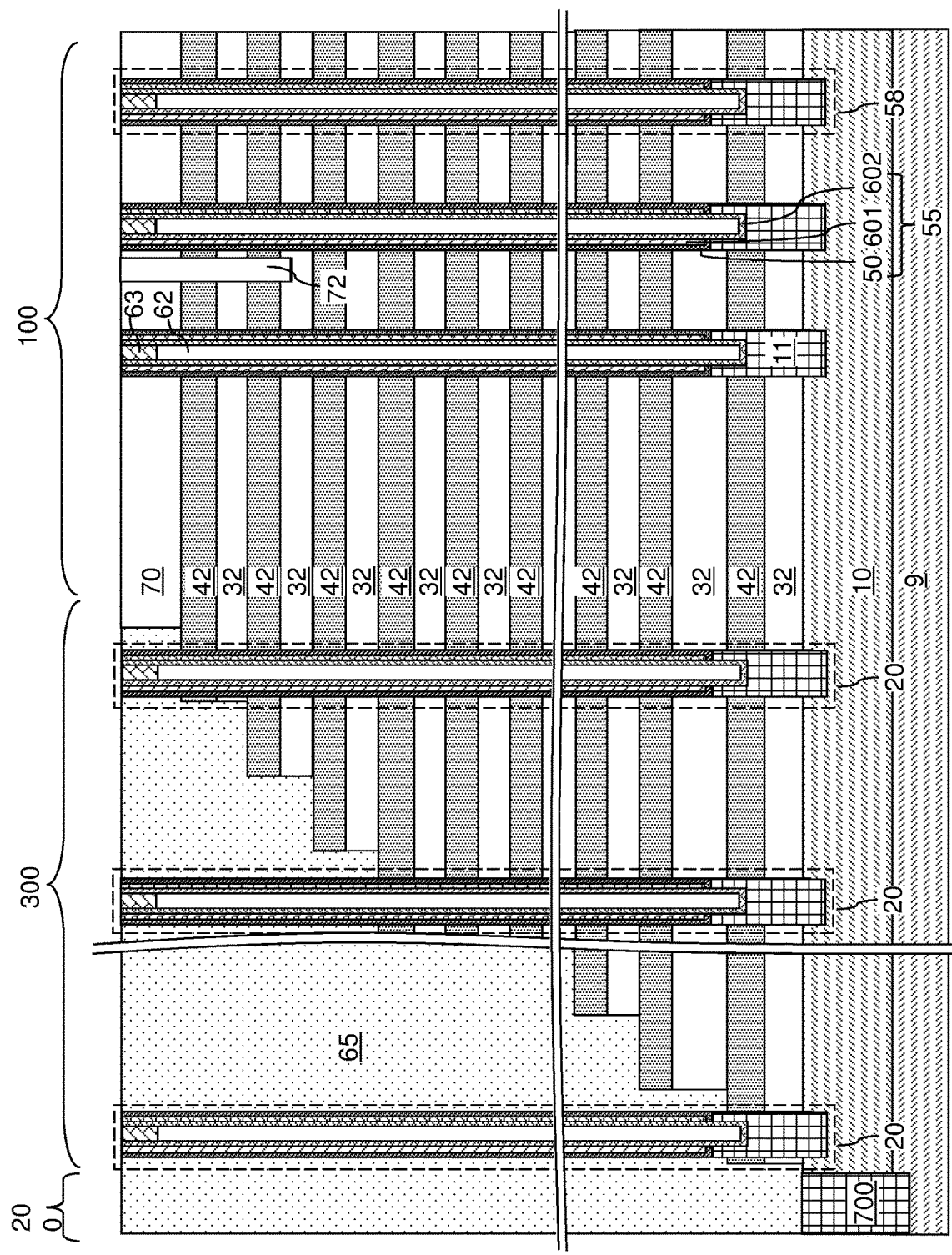
FIG. 6A is a schematic vertical cross-sectional view of the exemplary structure after formation of memory stack structures and support pillar structures according to an embodiment of the present disclosure.

Referring to FIG. 6A, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the vertical semiconductor channel 60.

The memory opening fill structures 58 may be formed in rows that extend along the first horizontal direction hd1. In one embodiment, each row of memory opening fill structures 58 may comprise a one-dimensional periodic array of memory opening fill structures 58 having a uniform pitch that is the same as the memory opening pitch mo_p. Further, the rows of memory opening fill structures 58 may be laterally spaced apart with the uniform inter-row pitch ir_p along the second horizontal direction hd2. In other words, lines connecting geometrical centers of memory opening fill structures within a same row may be laterally spaced apart by the uniform inter-row pitch within each cluster of memory opening fill structures 58. In one embodiment, five rows of memory opening fill structures 58 may be formed as a cluster arranged in a hexagonal two-dimensional periodic array, and include a first subset SS1 of memory opening fill structures 58 located within an inner row, a second subset SS2 of memory opening fill structures 58 located within a pair of intermediate rows immediately next to the inner row, and a third subset SS3 of memory opening fill structures 58 located within a pair of outer rows immediately next to the intermediate rows.

The drain regions 63 are located on an upper end of a respective one of the vertical semiconductor channels 60. The drain regions 63 may be arranged in multiple rows that laterally extend along the first horizontal direction hd1. Each row of drain regions 63 includes a respective subset of the drain regions 63 that are arranged along the first horizontal direction with the uniform memory opening pitch mo_p. The multiple rows of the drain regions 63 are laterally spaced apart between one another along the second horizontal direction with the uniform inter-row pitch ir_p.

A first subset of the drain regions 63 may be provided within each first subset SS1 of memory opening fill structures 58. Thus, each drain region 63 within the first subset of drain regions 63 may be located within an inner row of memory opening fill structures 58. A second subset of the drain regions 63 may be provided within each second subset SS2 of memory opening fill structures 58. Thus, each drain region 63 within the second subset of drain regions 63 may be located within one of the intermediate rows of memory opening fill structures 58. A third subset of the drain regions 63 may be provided within each third subset SS3 of memory opening fill structures 58. Thus, each drain region 63 within the third subset of drain regions 63 may be located within one of the outer rows of memory opening fill structures 58. In one embodiment, neighboring rows of drain regions 63 within the multiple rows of drain regions 63 are laterally offset along the first horizontal direction hd1 with respect to each other by one half of the uniform memory opening pitch mo_p.

Figure 7A:
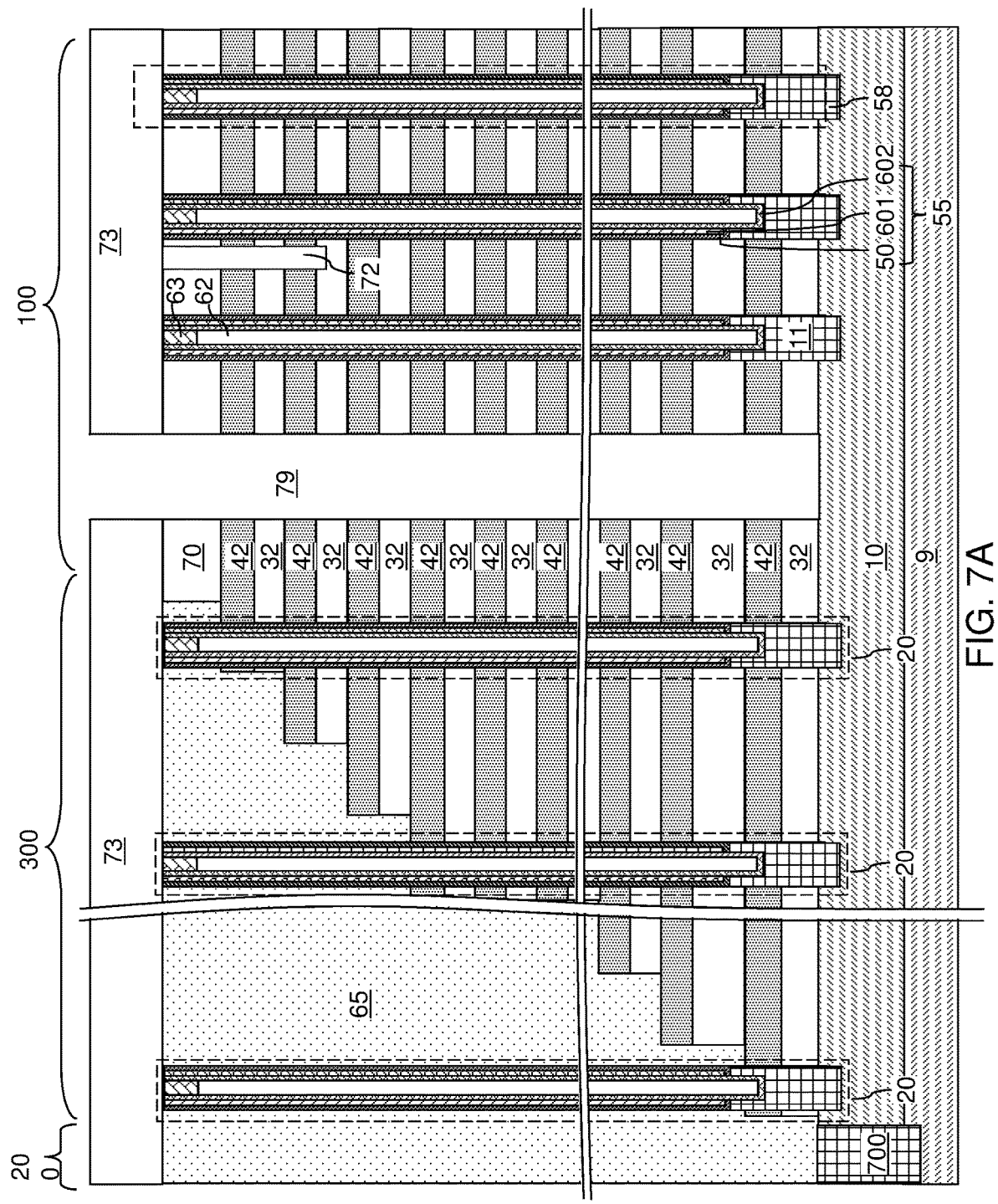
FIG. 7A is a schematic vertical cross-sectional view of the exemplary structure after formation of backside trenches according to an embodiment of the present disclosure.
Figure 7B:
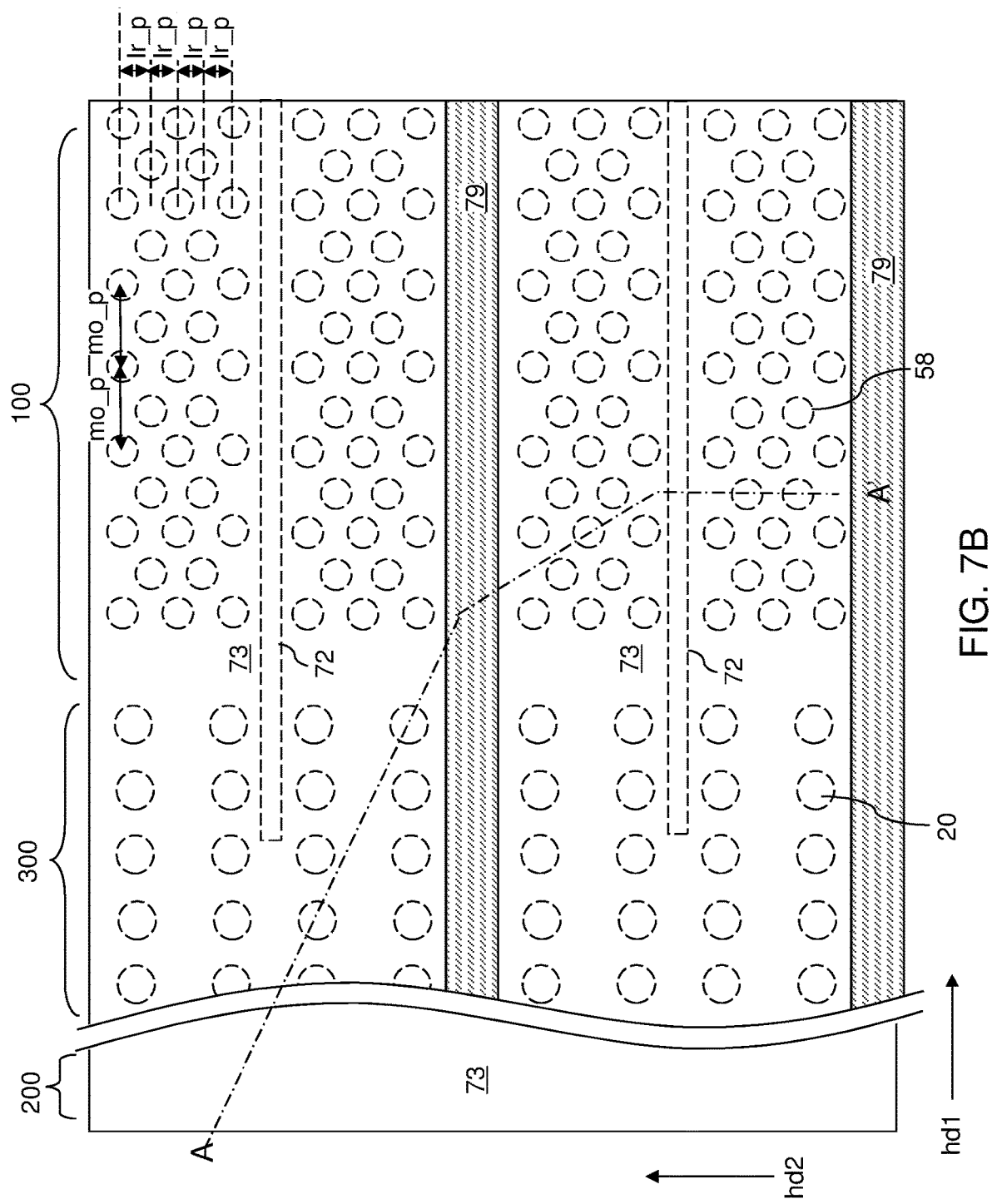
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart between one another along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 8:
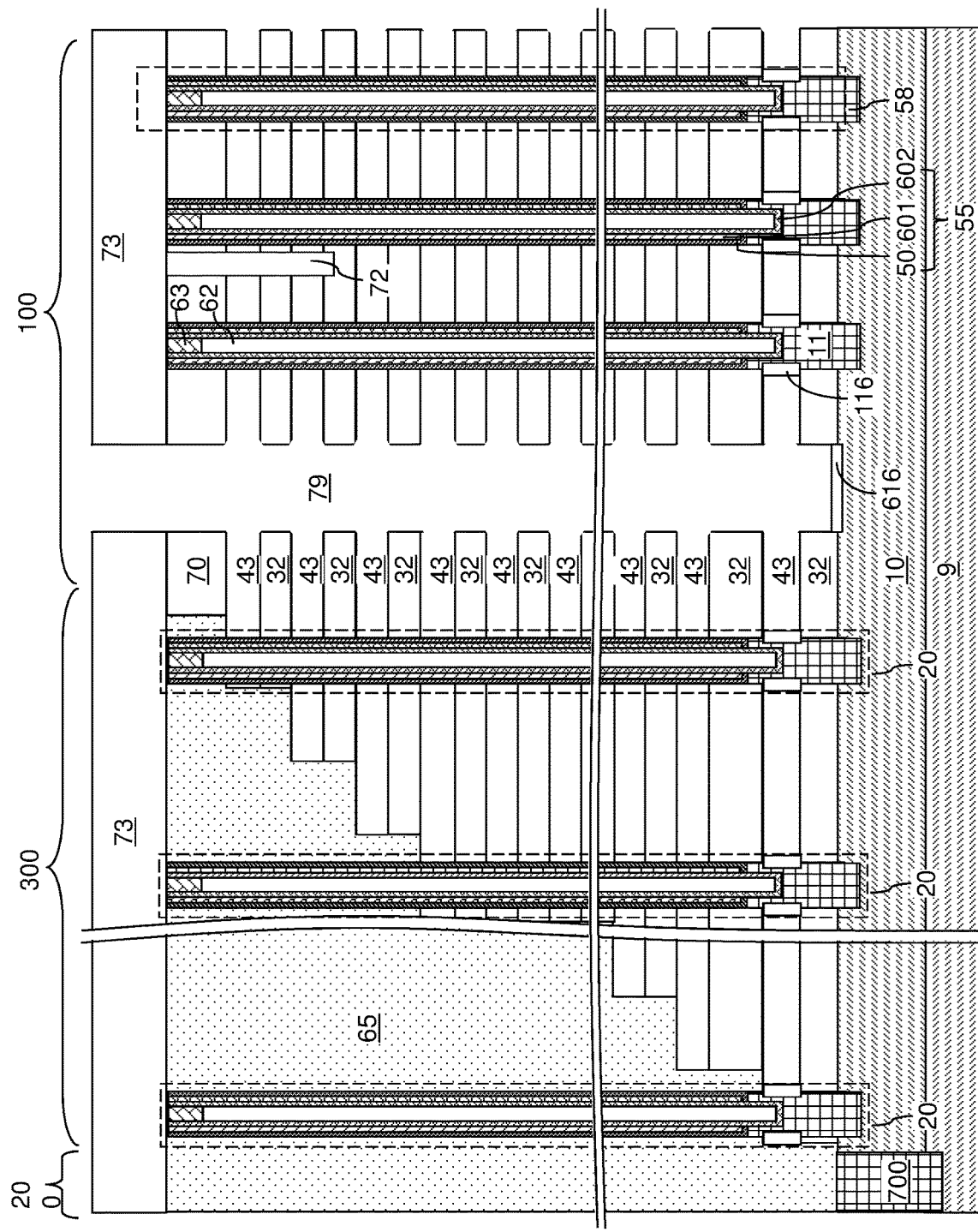
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 may be introduced into the backside trenches 79, for example, using an etch process. FIG. 9A illustrates a region of the exemplary structure of FIG. 8. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 9B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 10:
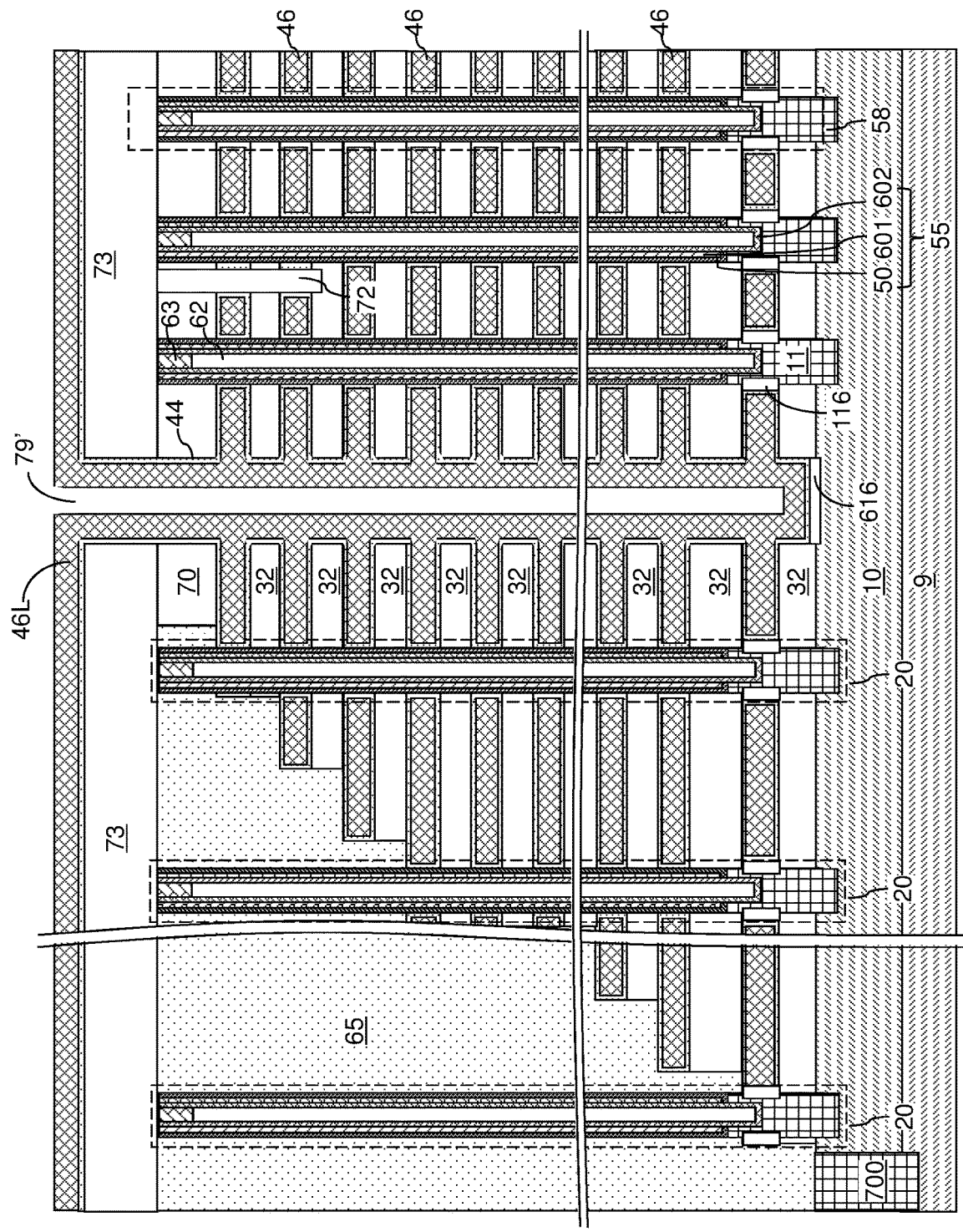
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous metallic material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
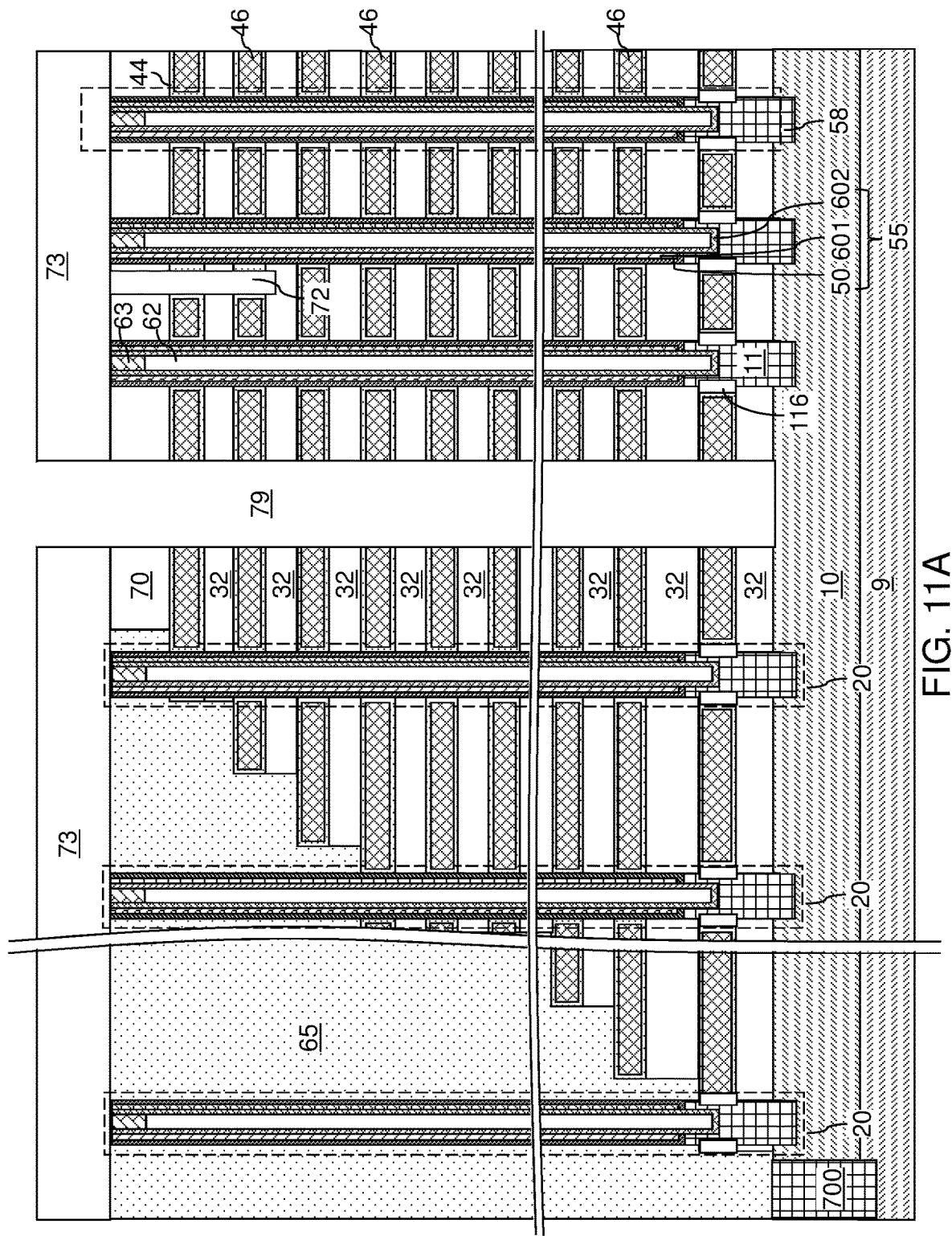
FIG. 11A is a schematic vertical cross-sectional view of the exemplary structure after removal of a deposited conductive material from within the backside trench according to an embodiment of the present disclosure.
Figure 11B:
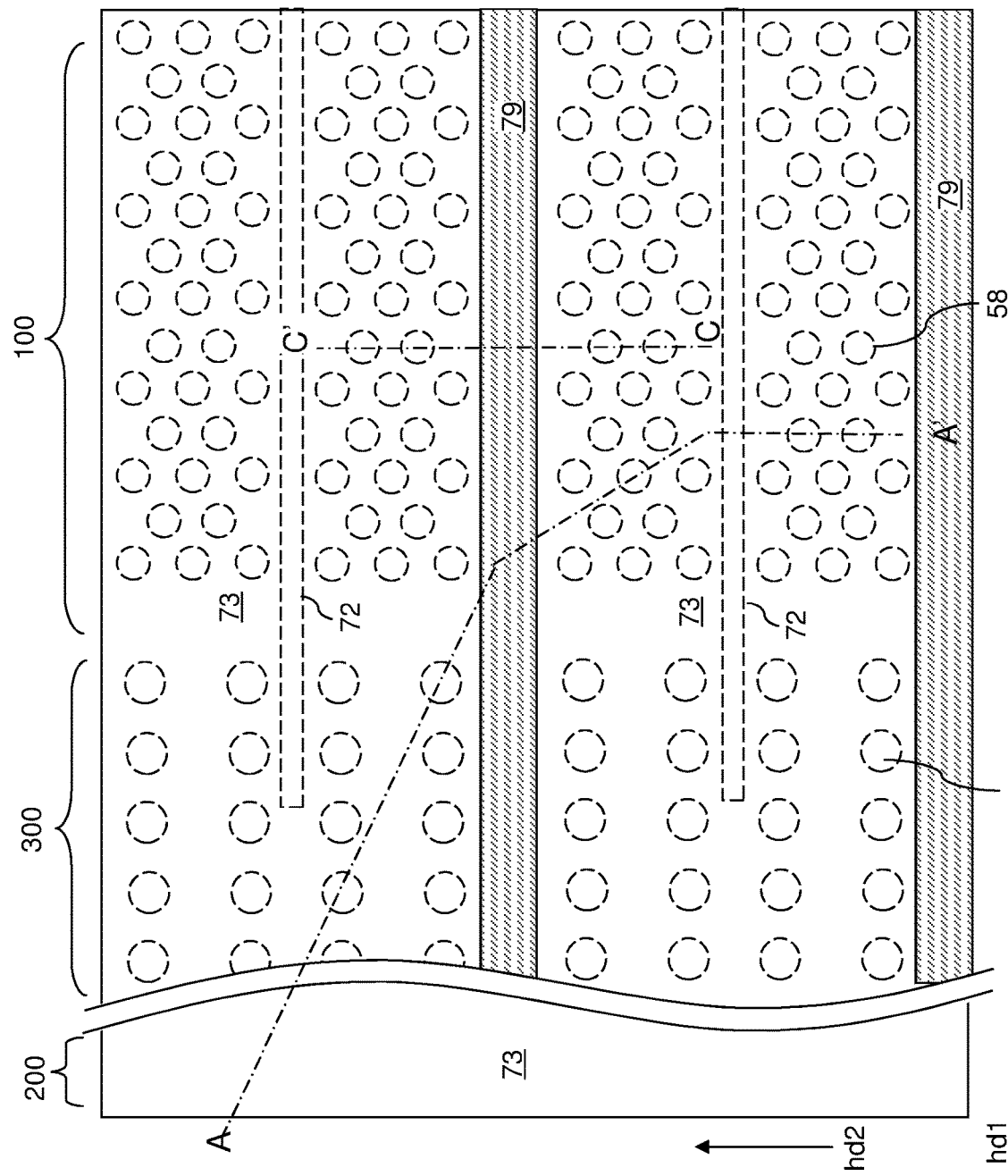
FIG. 11B is a partial see-through top-down view of the exemplary structure of FIG. 11A. The vertical plane A-A' is the plane of the schematic vertical cross-sectional view of FIG. 11A.
Figure 11C:
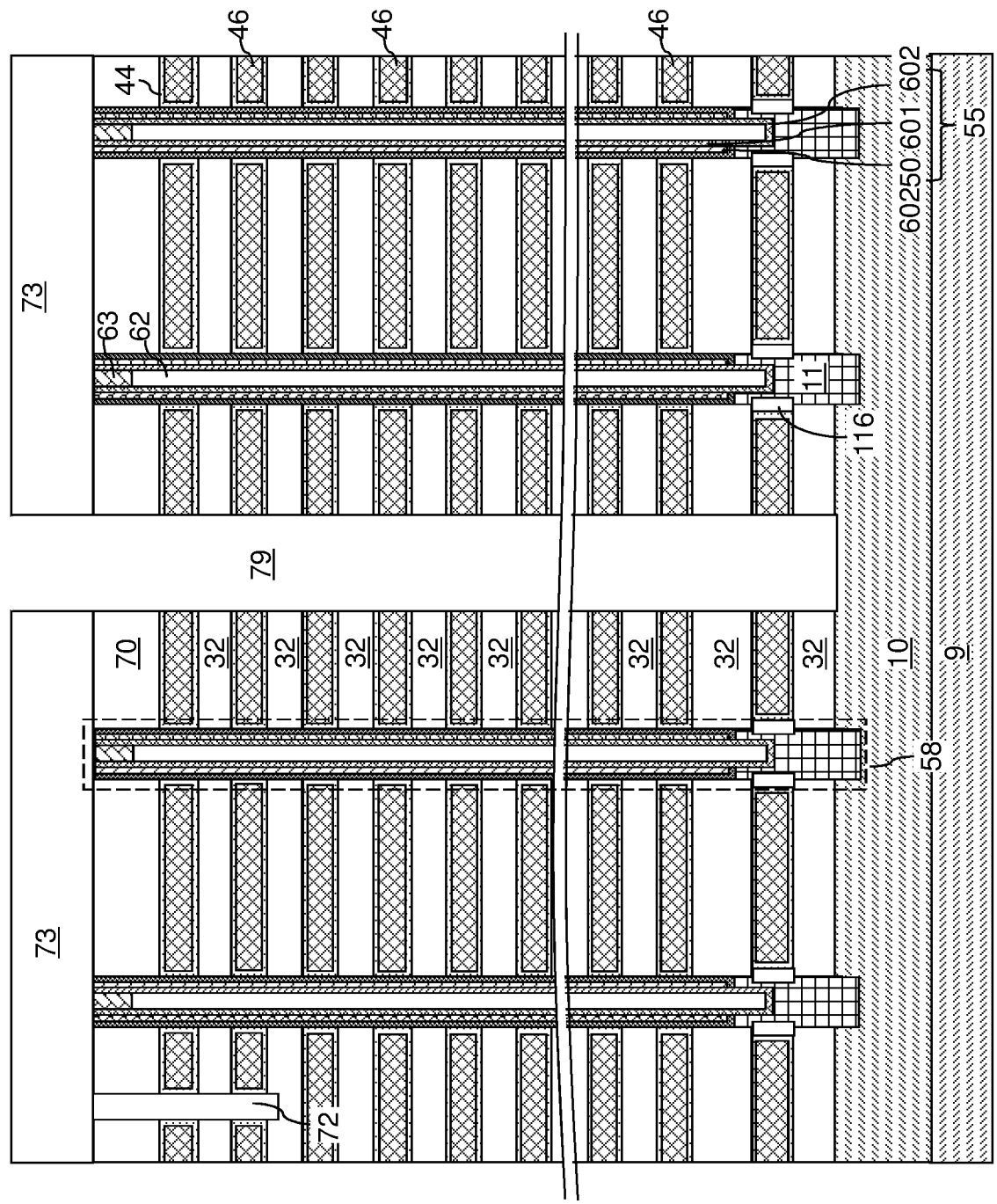
FIG. 11C is a vertical cross-sectional view of the exemplary structure along the vertical plane C-C' of FIG. 11B.

Referring to FIGS. 11A-11C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity 79' is present within each backside trench 79.

Figure 12A:
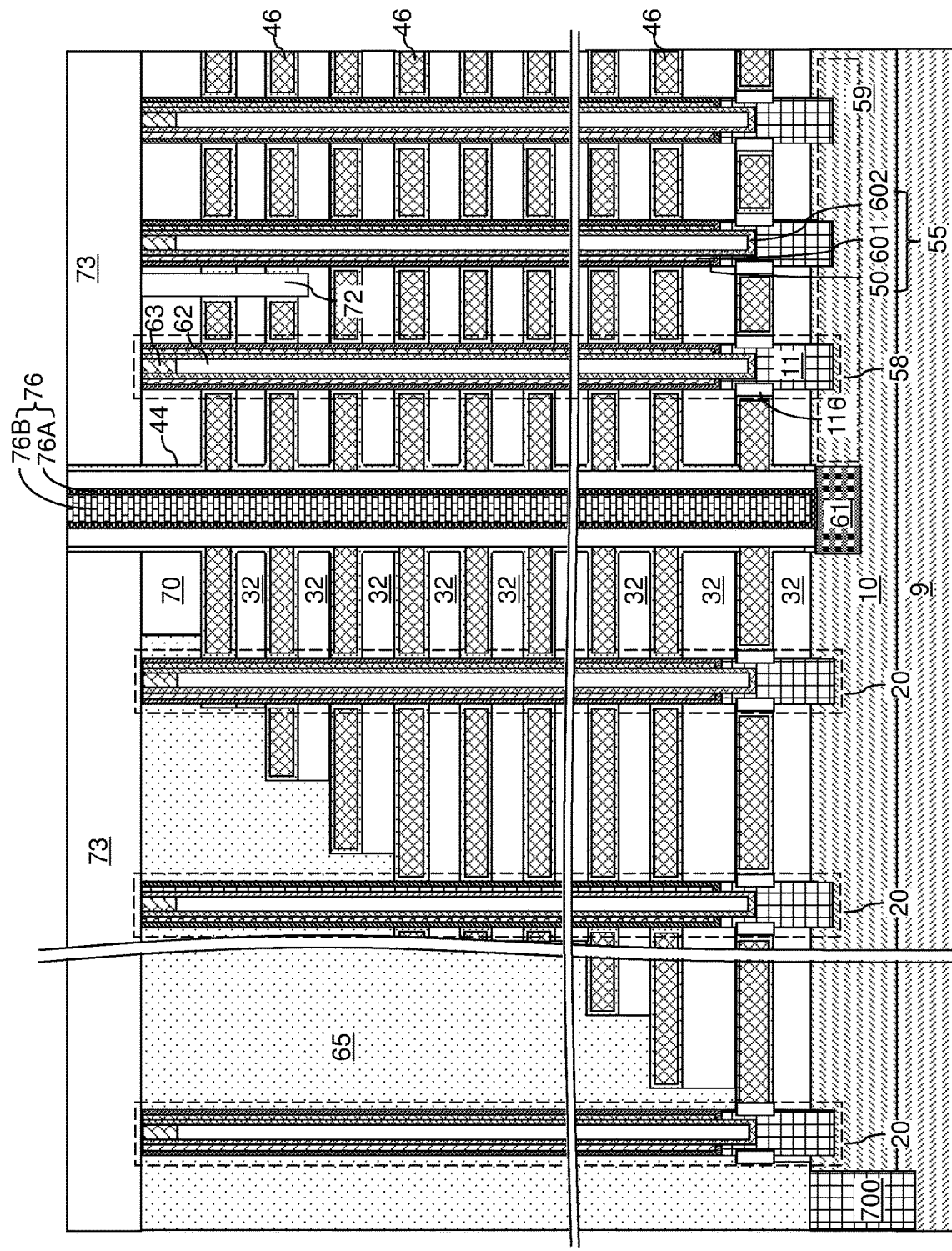
FIG. 12A is a schematic vertical cross-sectional view of the exemplary structure after formation of an insulating spacer and a backside contact structure according to an embodiment of the present disclosure.
Figure 12B:
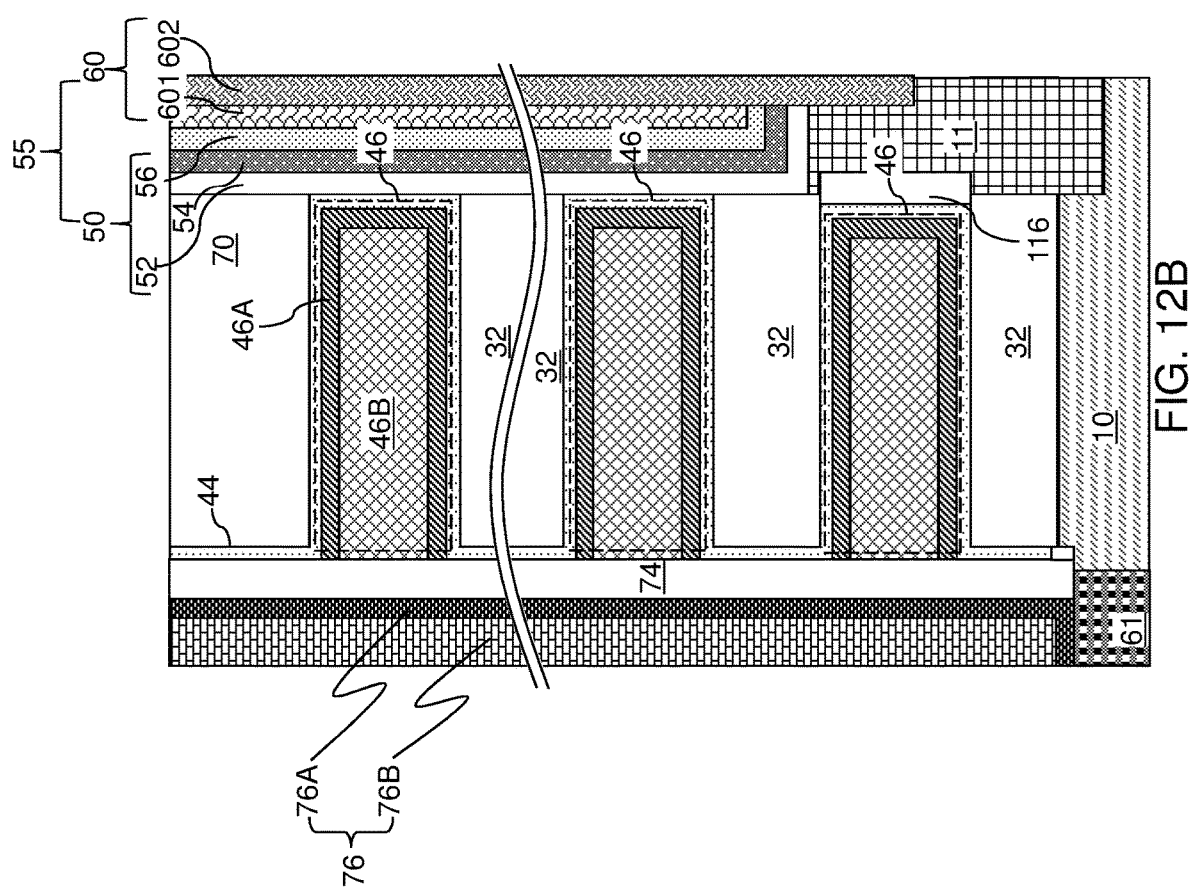
FIG. 12B is a magnified view of a region of the exemplary structure of FIG. 12A.

Referring to FIGS. 12A and 12B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 13A:
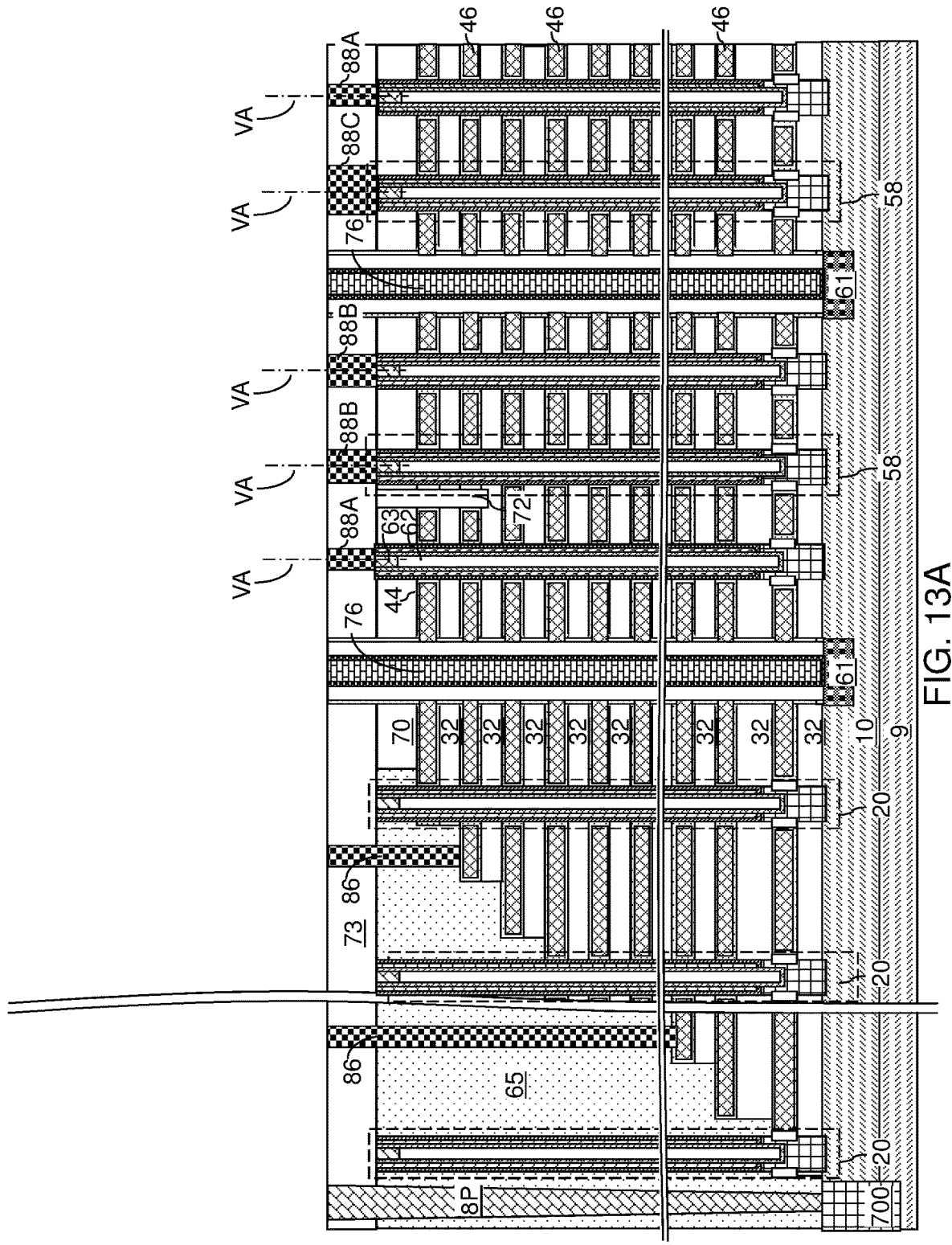
FIG. 13A is a schematic vertical cross-sectional view of the exemplary structure after formation of drain contact via structures and additional contact via structures according to an embodiment of the present disclosure.
Figure 13B:
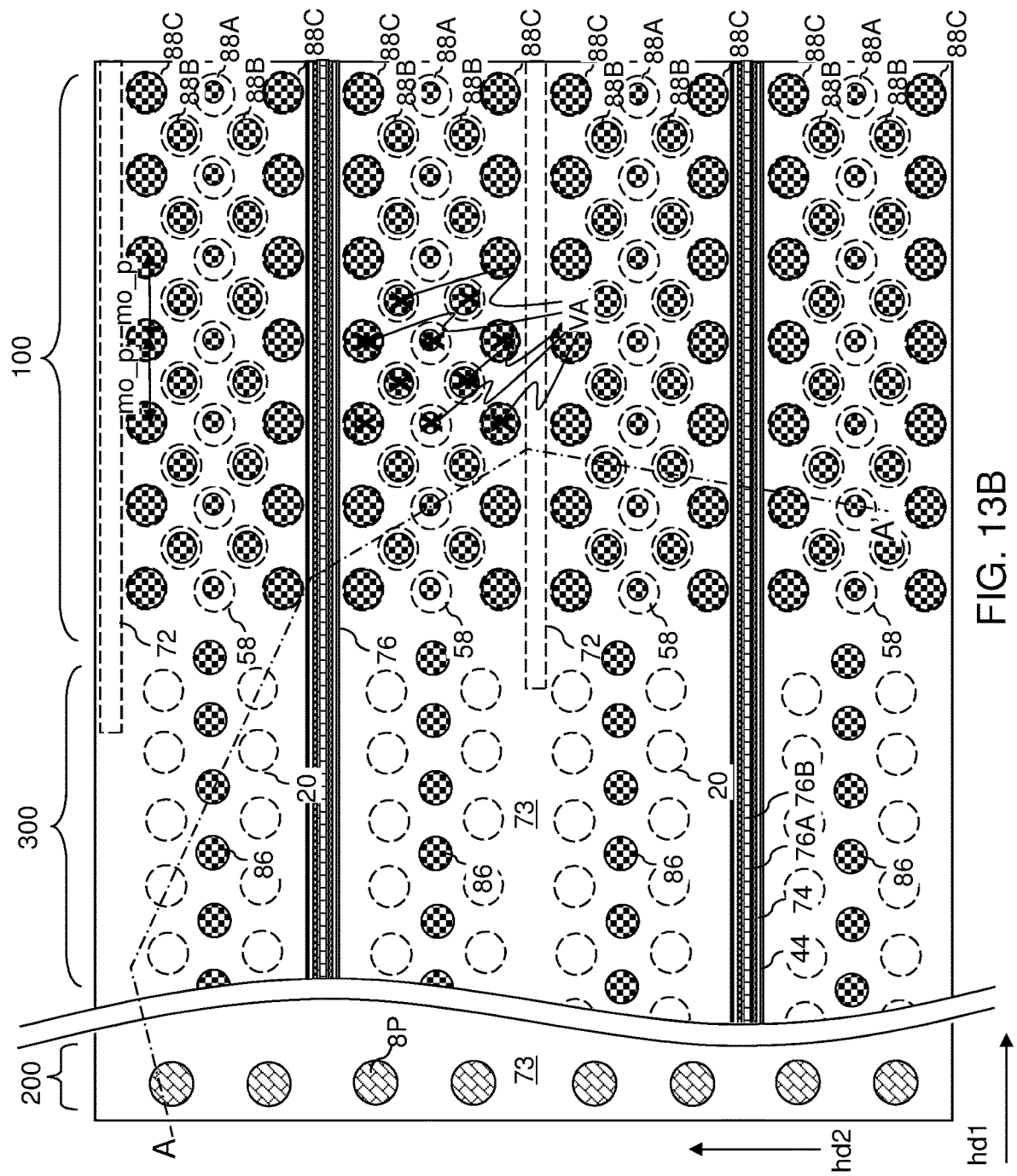
FIG. 13B is a top-down view of the exemplary structure of FIG. 13A. The vertical plane A-A' is the plane of the schematic vertical cross-sectional view of FIG. 13A.
Figure 13C:
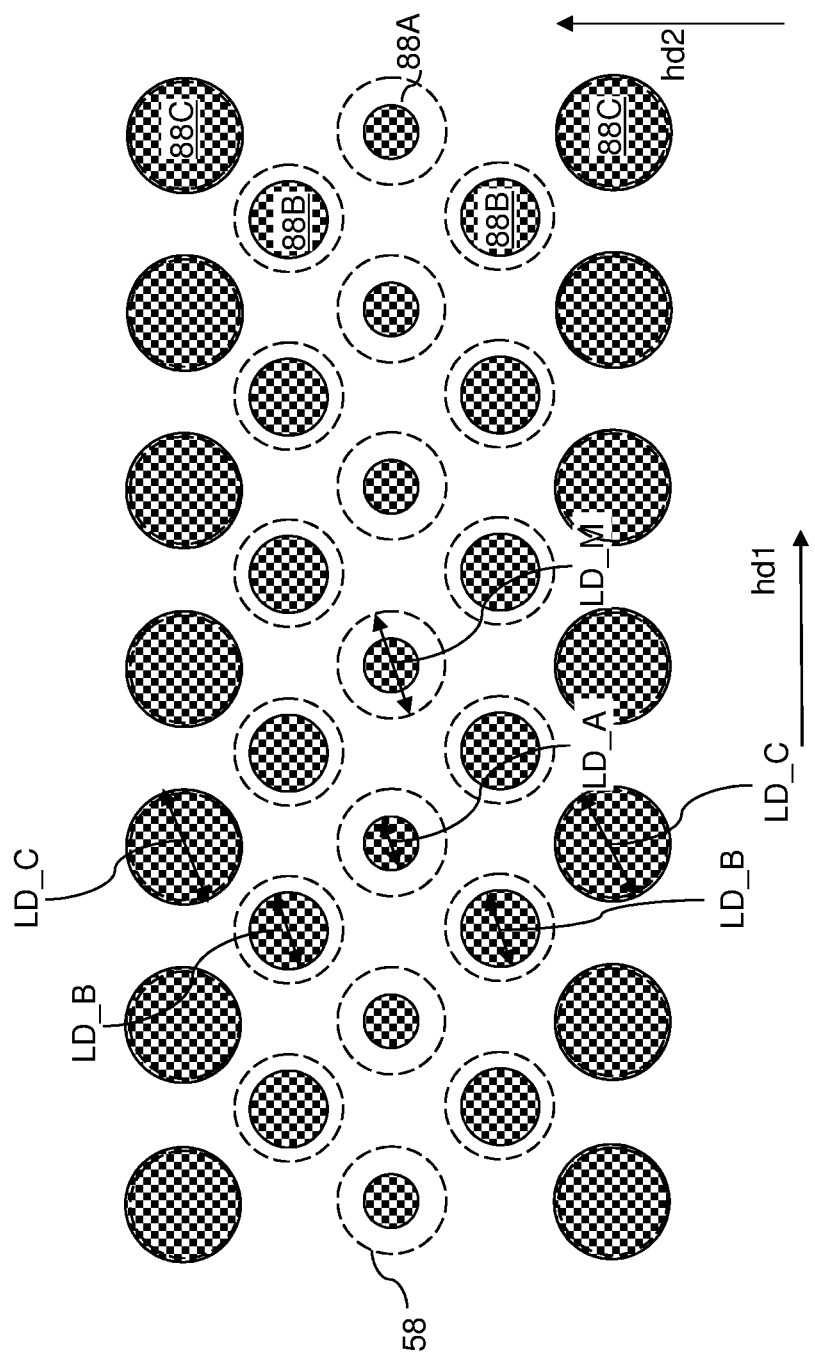
FIG. 13C is a magnified view of a region in FIG. 13B.

Referring to FIGS. 13A-13C, additional contact via structures (88A, 88B, 88C, 86, 8P) of varying (i.e., different) size (i.e., lateral dimension) may be formed through the contact level dielectric layer 73, and optionally through the retro-stepped dielectric material portion 65. For example, drain contact via structures (88A, 88B, 88C) of varying (i.e., different) size (i.e., lateral dimension) may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices.

Figure 6B:
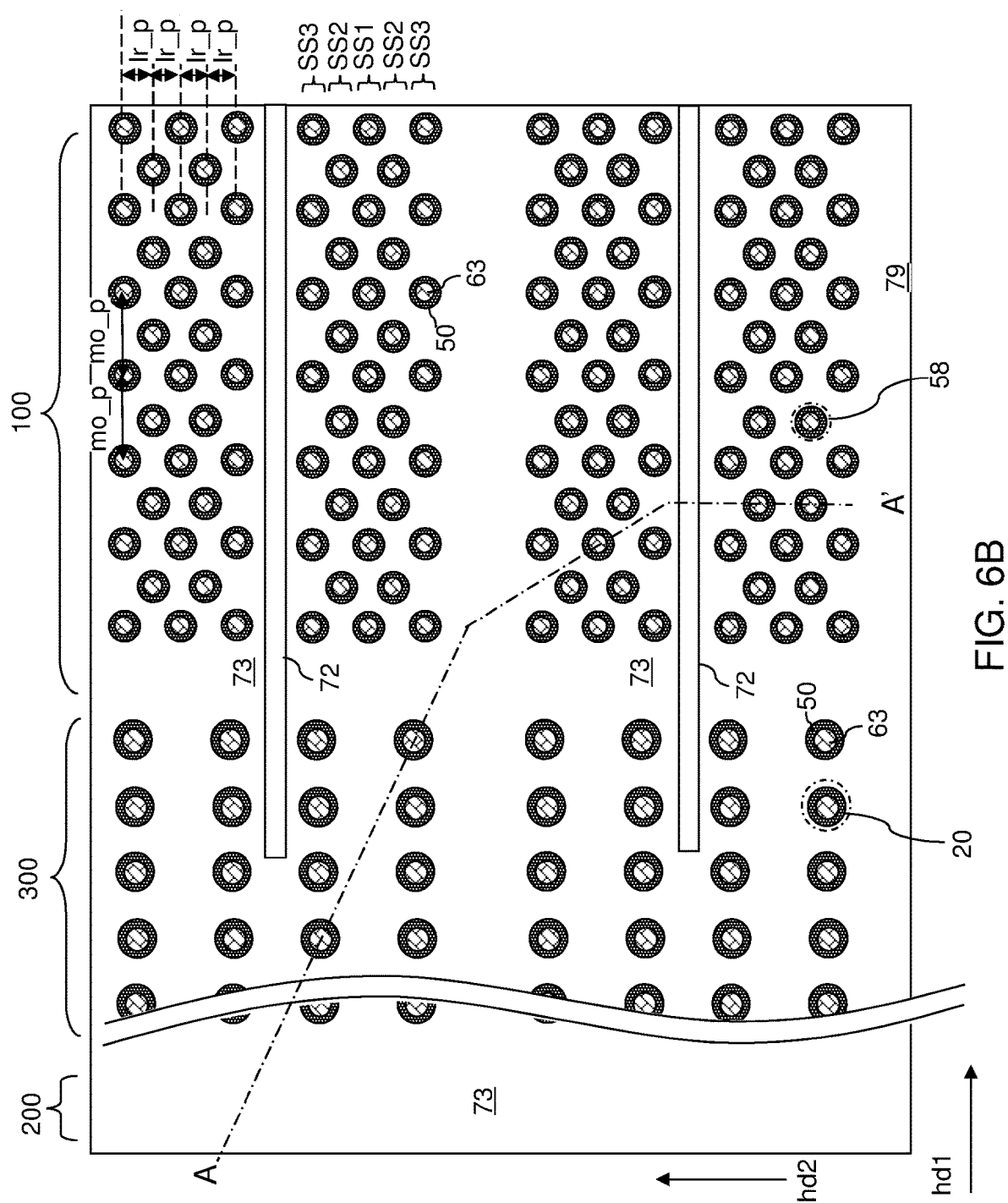
FIG. 6B is a partial see-through top-down view of the exemplary structure of FIG. 6A. The vertical plane A-A' is the plane of the schematic vertical cross-sectional view of FIG. 6A.

The drain contact via structures (88A, 88B, 88C) include first contact via structures 88A contacting a respective drain region 63 from the first subset of the drain regions 63 located within a first subset SS1 (shown in FIG. 6B) of memory opening fill structures 58, second contact via structures 88B contacting a respective drain region 63 from the second subset of the drain regions 63 located within a second subset SS2 (shown in FIG. 6B) of memory opening fill structures 58, and third contact via structures 88C contacting a respective drain region 63 from the third subset of the drain regions 63 located within a third subset SS3 (shown in FIG. 6B) of memory opening fill structures 58. Each cluster of drain regions 63 may be arranged as multiple rows, such as five rows, of drain regions 63 extending along the first horizontal direction hd1. Each drain region 63 within the first subset of drain regions 63 may be located within an inner row of memory opening fill structures 58. Each drain region 63 within the second subset of drain regions 63 may be located within one of the intermediate rows of memory opening fill structures 58. Each drain region 63 within the third subset of drain regions 63 may be located within one of the outer rows of memory opening fill structures 58.

The drain contact via structures (88A, 88B, 88C) may be formed by simultaneously forming first contact via cavities extending to a respective one of the first subset of drain regions 63, second contact via cavities extending to a respective one of the second subset of drain regions 63, and third contact via cavities extending to a respective one of the third subset of drain regions 63 through the contact level dielectric layer 73 using a same anisotropic etch process. With reference to FIG. 13C, the lateral dimensions of the first contact via cavities, the second contact via cavities, and third contact via cavities are selected such that the third lateral dimension LD_C of each third contact via cavity is greater than the second lateral dimension LD_B of each second contact via cavity, and the second lateral dimension LD_B of each second contact via cavity is greater than the first lateral dimension LD_A of each first contact via cavity. As used herein, a "lateral dimension" of an element refers to the maximum lateral dimension of the element. In one embodiment, each of the first contact via cavities, the second contact via cavities, and third contact via cavities may have a respective substantially circular horizontal cross-sectional shape.

In one embodiment, the first lateral dimension LD_A and the second lateral dimension LD_B may be less than the lateral dimension LD_M of a memory opening fill structure 58. In one embodiment, the memory opening fill structures 58 may have a circular horizontal cross-sectional shape, and the lateral dimension LD_M of each memory opening fill structure 58 may be the diameter of the horizontal cross-sectional shape. The third lateral dimension LD_C may be greater than, or less than, the lateral dimension LD_M of the memory opening fill structures 58.

At least one conductive material is deposited in the first contact via cavities, the second contact via cavities, and the third conductive via cavities. The at least one conductive material may include a metallic liner material such as TiN, TaN, or WN, and at least one metallic fill material such as tungsten. Excess portions of the at least one conductive material may be removed from above the horizontal plane including the top surface of the contact level dielectric layer 73. The first contact via structures 88A, the second contact via structures 88B, and the third contact via structures 88C are formed simultaneously in the first contact via cavities, the second contact via cavities, and the third conductive via cavities, respectively, by the remaining portions of the at least one conductive material.

The first contact via structures 88A are formed directly on the first subset of the drain regions 63. Each of the first contact via structures 88A has a first horizontal cross-sectional area. The second contact via structures 88B are formed directly on the second subset of the drain regions 63. Each of the second contact via structures 88B has a second horizontal cross-sectional area that is greater than the first horizontal cross-sectional area. The third contact via structures 88C are formed directly on the third subset of the drain regions 63. Each of the third contact via structures 88C has a third horizontal cross-sectional area that is greater than the second horizontal cross-sectional area. The first contact via structures 88A, the second contact via structures 88B, and the third contact via structures 88C may have the same height, which may be the thickness of the contact level dielectric layer 73. In one embodiment, each of the first contact via structures 88A has a first circular cylindrical shape with a first radius, each of the second contact via structures 88B has a second circular cylindrical shape with a second radius that is greater than the first radius, and each of the third contact via structures 88C has a third circular cylindrical shape with a third radius that is greater than the second radius.

In one embodiment, each cluster of the first contact via structures 88A, the second contact via structures 88B, and the third contact via structures 88C may be located between a backside contact via structure 76 and a drain select level isolation structure 72, or a neighboring pair of drain select level isolation structures 72. Each cluster of the first contact via structures 88A, the second contact via structures 88B, and the third contact via structures 88C may be arranged in five rows that laterally extend along the first horizontal direction hd1 and laterally spaced apart along the second horizontal direction hd2. In one embodiment, the five rows may include, from one side to another, a first row of a first subset of the third contact via structures 88C, a second row of a first subset of the second contact via structures 88B, a third row of a set of the first contact via structures 88A, a fourth row of a second subset of the second contact via structures 88B, and a fifth row of a second subset of the third contact via structures 88C.

In one embodiment, neighboring rows of drain regions 63 within the multiple rows of drain regions 63 are laterally offset along the first horizontal direction hd1 with respect to each other by one half of the uniform memory opening pitch mo_p. Each of the first contact via structures 88A, the second contact via structures 88B, and the third contact via structures 88C may be formed at the geometrical center of an underlying one of the drain regions 63. A set of vertical axes VA passing through the geometrical center of a respective one of the first contact via structures 88A may be laterally offset along the first horizontal direction hd1 with respect to a set of vertical axes VA passing through the geometrical center of a respective one of the second contact via structures 88B by one half of the uniform memory opening pitch mo_p. The set of vertical axes VA passing through the geometrical center of a respective one of the second contact via structures 88B may be laterally offset along the first horizontal direction hd1 with respect to a set of vertical axes VA passing through the geometrical center of a respective one of the third contact via structures 88C by one half of the uniform memory opening pitch mo_p.

Figure 14A:
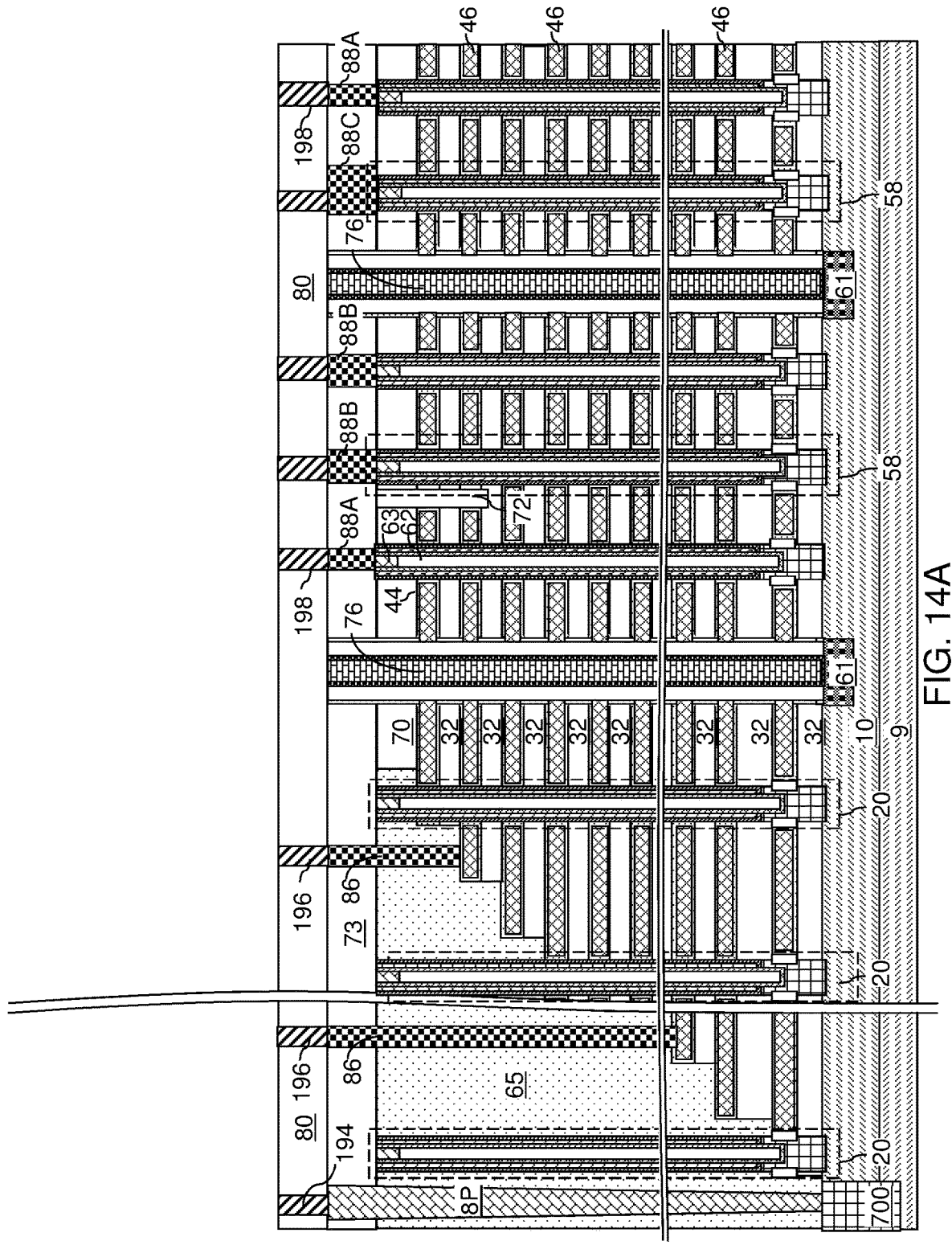
FIG. 14A is a schematic vertical cross-sectional view of the exemplary structure after formation of bit line connection via structures according to an embodiment of the present disclosure.
Figure 14B:
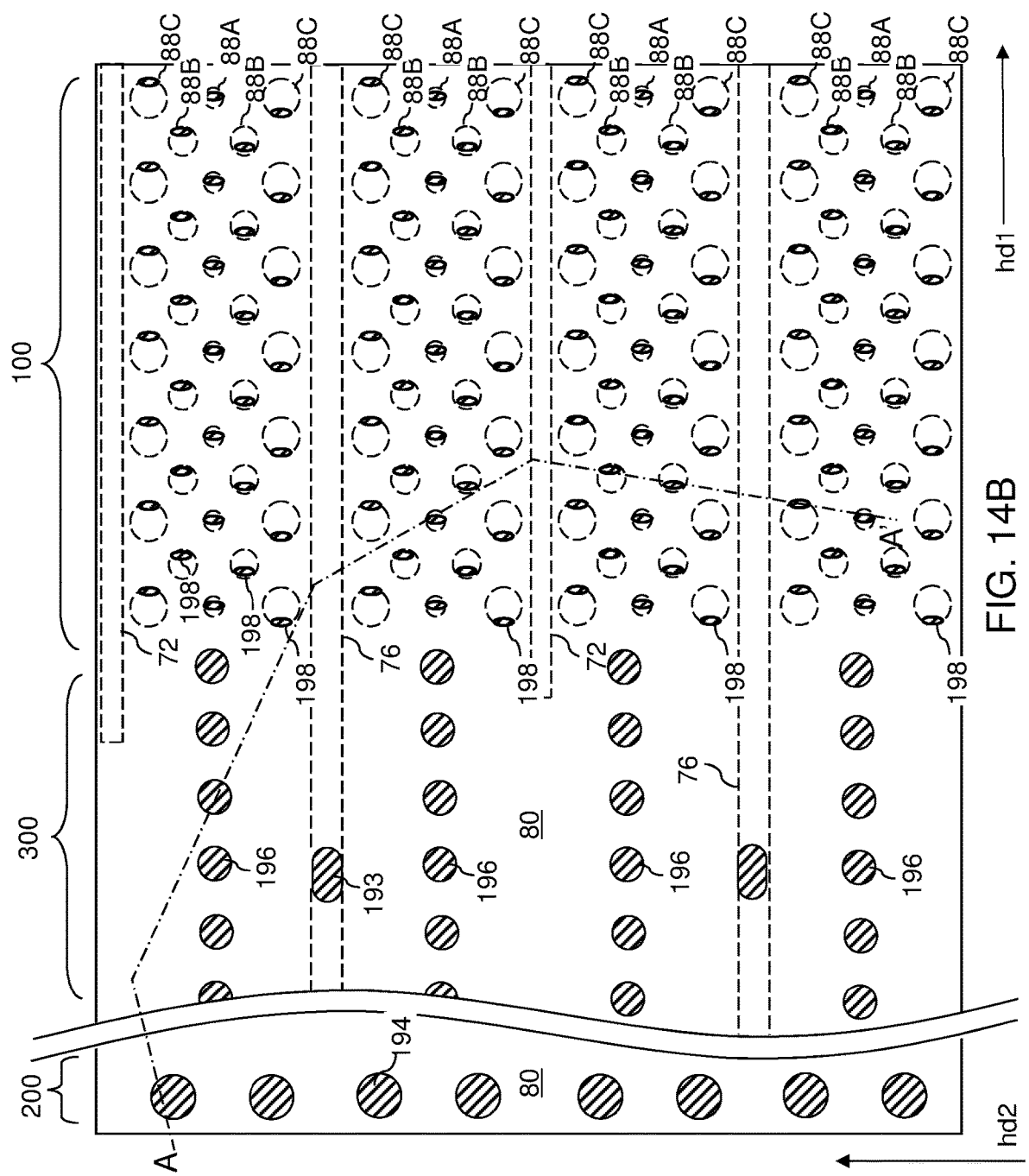
FIG. 14B is a top-down view of the exemplary structure of FIG. 14A. The vertical plane A-A' is the plane of the schematic vertical cross-sectional view of FIG. 14A.

Referring to FIGS. 14A-14C, a via level dielectric layer 80 may be formed over the contact level dielectric layer 73. The via level dielectric layer 80 includes a dielectric material such as undoped silicate glass, a doped silicate glass, or organosilicate glass. The thickness of the via level dielectric layer 80 may be in a range from 100 nm to 500 nm, although lesser and greater thicknesses may also be used.

Various connection via structures (198, 196, 194) may be formed through the via level dielectric layer 80. For example, bit line connection via structures 198 may be formed on the drain contact via structures (88A, 88B, 88C), word line connection via structures 196 may be formed on the word line contact via structures 86, and peripheral extension via structures 194 may be formed on the peripheral device contact via structures 8P.

In one embodiment, the bit line connection via structures 198 are elongated along the second horizontal direction (e.g., bit line direction) with a length-to-width ratio in a range from 1.5 to 5. In one embodiment, the bit line connection via structures 198 comprise a row of first bit line connection via structures 198A contacting the first contact via structures 88A, a row of second bit line connection via structures 198B contacting the second contact via structures 88B, and a row of third bit line connection via structures 198C contacting the third contact via structures 88C. In one embodiment, the bit line connection via structures 198 have a same length and a same width.

According to an embodiment of the present disclosure, at least a subset of the various bit line connection via structures 198 may be geometrically offset from the vertical axes VA passing through the geometrical centers of the underlying drain contact via structures (88A, 88B, 88C). In one embodiment, each cluster of drain contact via structures (88A, 88B, 88C) located between a neighboring pair of a backside contact via structure 76 and a drain select level isolation structure 72 or between a neighboring pair of drain select level isolation structures 72 may be arranged as five rows of drain contact via structures (88A, 88B, 88C) that include a row of first contact via structures 88A, two rows of second contact via structures 88B, and two rows of third contact via structures 88C. Bit lines to be subsequently formed over the bit line connection via structures 198 may laterally extend along the second horizontal direction hd2, and may have a uniform bit line pitch p along the first horizontal direction hd1. The uniform bit line pitch p is the center-to-center distance between a neighboring pair of bit lines to be subsequently formed.

In one embodiment, the memory opening pitch mo_p may be five times the uniform bit line pitch p. In one embodiment, each row of third bit line connection via structures 198C may be laterally offset along the first horizontal direction hd1 from the row of the first bit line connection via structures 198A by the uniform bit line pitch p. In one embodiment, one row of the third bit line connection via structures 198C may be laterally offset toward the first horizontal direction hd1 from the row of the first bit line connection via structures 198A by the uniform bit line pitch p, and another of the third bit line connection via structures 198C may be laterally offset against the first horizontal direction hd1 from the row of the first bit line connection via structures 198A by the uniform bit line pitch p, i.e., along the opposite direction of the shift of the one row of the third bit line connection via structures 198C relative to the row of the first bit line connection via structures 198A.

In one embodiment, each row of second bit line connection via structures 198B is laterally offset along the first horizontal direction hd1 from the row of the first bit line connection via structures 198A by three times the uniform bit line pitch p, and each row of second bit line connection via structures 198B is laterally offset along the first horizontal direction hd1 from a row of the third bit line connection via structures 198C by twice the uniform bit line pitch p. In one embodiment, one row of the second bit line connection via structures 198B may be laterally offset toward the first horizontal direction hd1 from the row of the first bit line connection via structures 198A by three times the uniform bit line pitch p, and another of the second bit line connection via structures 198B may be laterally offset against the first horizontal direction hd1 from the row of the first bit line connection via structures 198A by three times the uniform bit line pitch p, i.e., along the opposite direction of the shift of the one row of the second bit line connection via structures 198B relative to the row of the first bit line connection via structures 198A.

The areas of the first contact via structures 88A, the second contact via structures 88B, and the third contact via structures 88C may be selected such that each of the first contact via structures 88A, the second contact via structures 88B, and the third contact via structures 88C does not extend significantly farther outward than the outer sidewalls of an overlying bit line connection via structure 198. In one embodiment, each of the first contact via structures 88A, the second contact via structures 88B, and the third contact via structures 88C may have a respective circular cylindrical shape, i.e., a cylindrical shape with a circular horizontal cross-sectional shape. Each of the first bit line connection via structures 198A may be centered on a respective underlying first contact via structures 88A. Thus, the diameter of each first contact via structure 88A may be about the maximum dimension of a bit line connection via structure 198. The geometrical center of each second bit line connection via structure 198B may be off-centered with respect to the vertical axis VA passing through the geometrical center of a respective underlying second contact via structure 88B by one half of the uniform bit line pitch p. Thus, the diameter of each second contact via structure 88B may be selected to provide an overlap with the entire area of an overlying second bit line connection via structure 198B, and thus, is greater than the diameter of the first contact via structures 88A. The geometrical center of each third bit line connection via structure 198C may be off-centered with respect to the vertical axis VA passing through the geometrical center of a respective underlying third contact via structure 88C by the uniform bit line pitch p. Thus, the diameter of each third contact via structure 88C may be selected to provide an overlap with the entire area of an overlying third bit line connection via structure 198C, and thus, is greater than the diameter of the second contact via structures 88B.

Figure 15A:
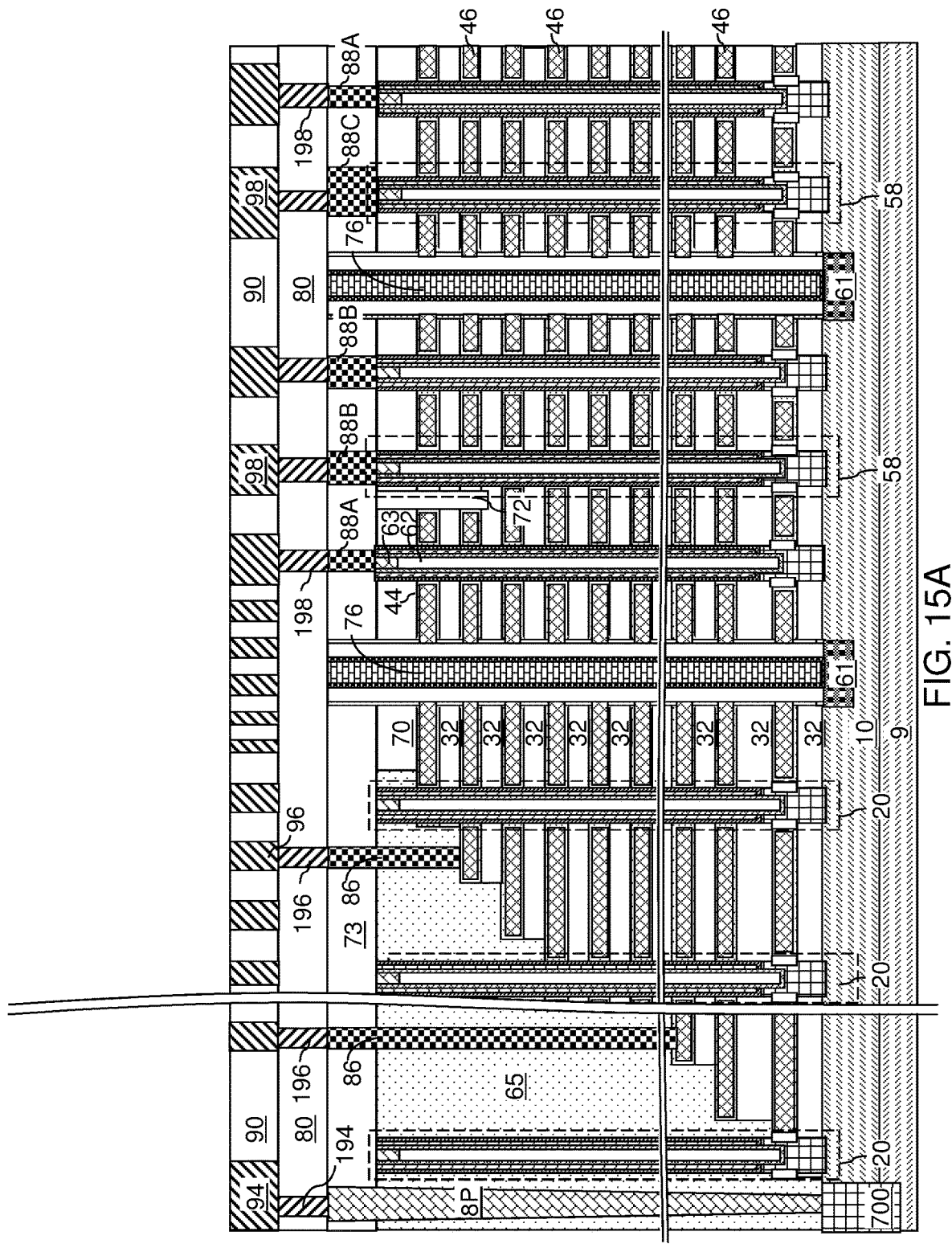
FIG. 15A is a schematic vertical cross-sectional view of the exemplary structure after formation of bit lines according to an embodiment of the present disclosure.
Figure 15B:
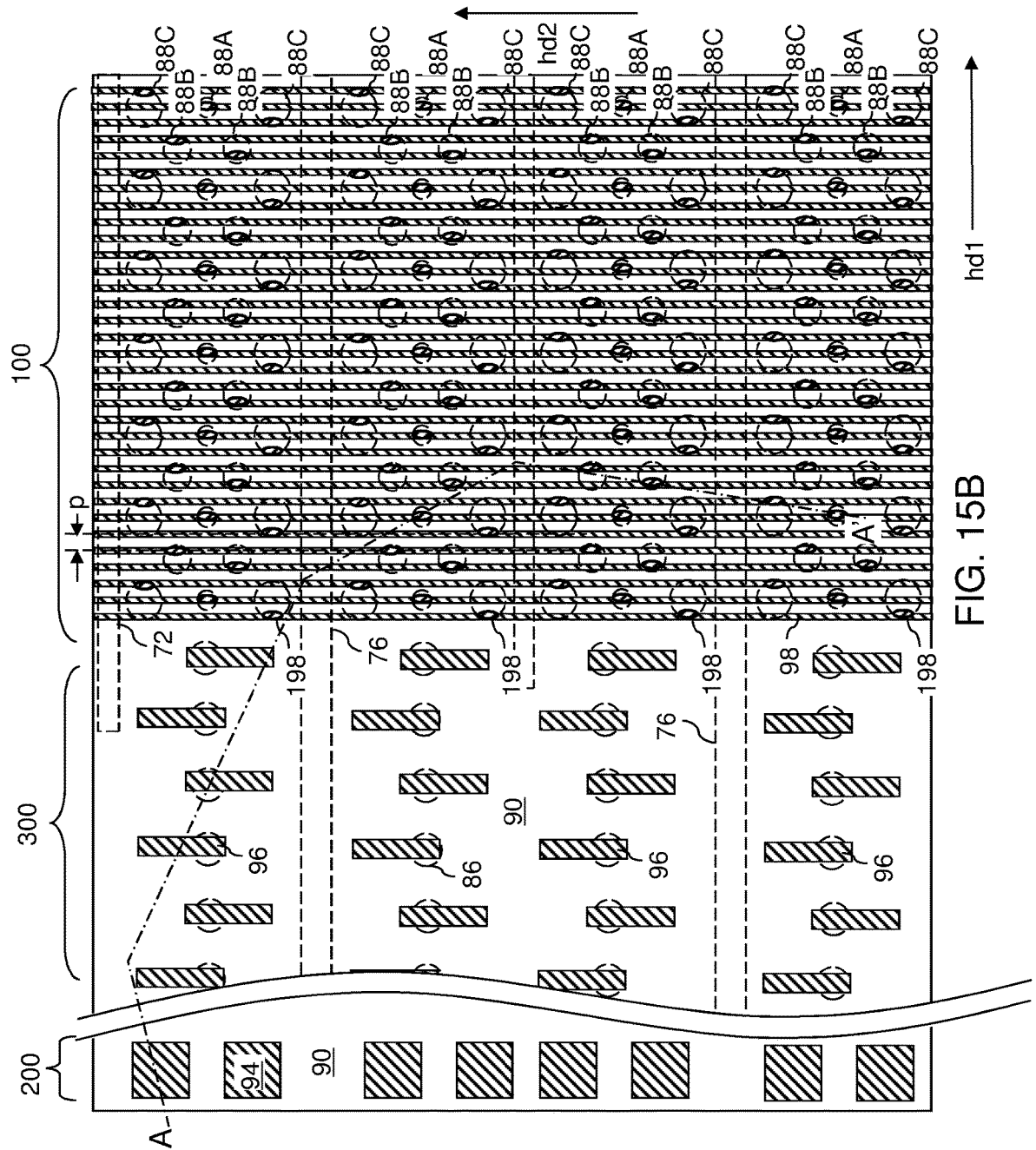
FIG. 15B is a top-down view of the exemplary structure of FIG. 15A. The vertical plane A-A' is the plane of the schematic vertical cross-sectional view of FIG. 15A.

Referring to FIGS. 15A and 15B, a first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The first line level metal interconnect structures (98, 96, 94) include bit lines 98 that are electrically connected to a respective plurality of the drain contact via structures 88 through a respective subset of the bit line connection via structures 198, a word-line-connection metal interconnect lines 98 that are electrically connected to a respective one of the word line contact via structures 86 through a respective word line connection via structure 196, and peripheral metal interconnect lines 94 that are electrically connected to a respective one of the peripheral device contact via structures 8P through a respective peripheral extension via structure 194. The bit lines 98 are electrically connected through the drain regions 63 to upper ends of a respective subset of the vertical semiconductor channels 60 in the memory stack structures 55 in the memory array region 100.

In one embodiment, the bit lines 98 may be formed directly on a respective subset of the bit line connection via structures 198. Each bit line 98 may contact only one bit line connection via structure 198 with each cluster of connection via structure 198 located between a neighboring pair of a backside contact via structure 76 and a drain select level isolation structure 72 or a neighboring pair of drain select level isolation structures 72. In one embodiment, the bit lines 98 laterally extend along the second horizontal direction hd2 and have the uniform bit line pitch p along the first horizontal direction hd1. Generally, the uniform memory opening pitch mo_p is an integer multiple of the uniform bit line pitch p. The integer multiple may be the number of rows of memory opening fill structures 58 within each cluster of memory opening fill structures 58 located between a neighboring pair of a backside contact via structure 76 and a drain select level isolation structure 72 or a neighboring pair of drain select level isolation structures 72.

Figure 16:
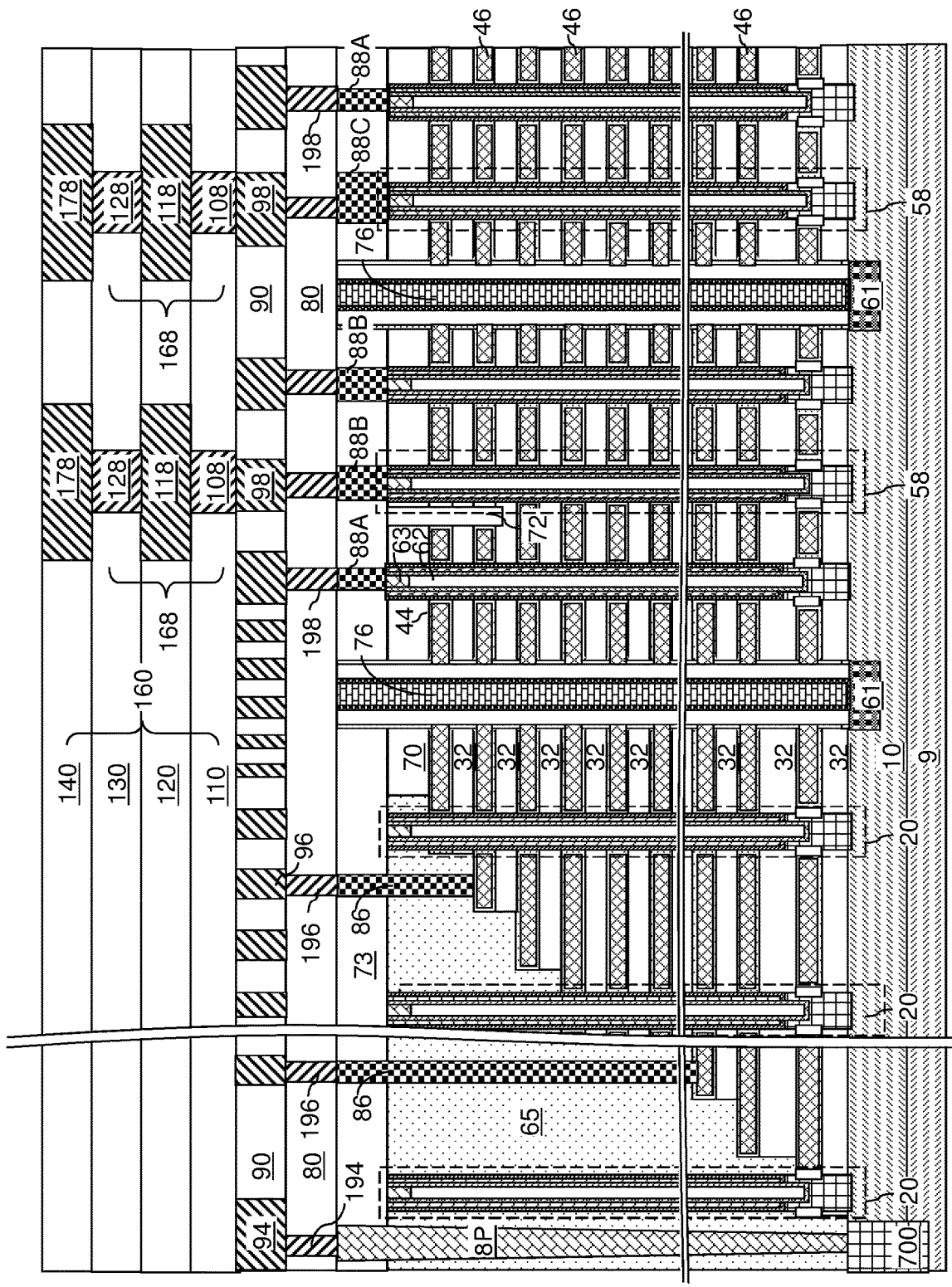
FIG. 16 is a schematic vertical cross-sectional view of the exemplary structure after formation of upper level metal interconnect structures according to an embodiment of the present disclosure.

Referring to FIG. 16, additional metal interconnect structures 168 may be formed within additional interconnect level dielectric layers 160. In an illustrative example, the additional interconnect level dielectric layers 160 may include a second via level dielectric layer 110, a second line level dielectric layer 120, a third via level dielectric layer 130, and a metallic pad structure level dielectric layer 140. The metal interconnect structures 168 may include first metal via structures 108 formed within the second via level dielectric layer 110, second metal line structures 118 formed within the second line level dielectric layer 120, second metal via structures 128 formed within the third via level dielectric layer 130, and bonding structures 178 (such as metallic pad structures) formed within the metallic pad structure level dielectric layer 140. While the present disclosure is described using an example in which the additional interconnect level dielectric layers 160 include the second via level dielectric layer 110, the second line level dielectric layer 120, the third via level dielectric layer 130, and the metallic pad structure level dielectric layer 140, embodiments are expressly contemplated herein in which the additional interconnect level dielectric layers 160 include a different number and/or different combinations of dielectric material layers.

Referring to all drawings and according to various embodiments of the present disclosure, a three-dimensional memory device is provided, which comprises: an alternating stack of insulating layers 32 and electrically conductive layers 46 located over a substrate (9, 10); memory stack structures 55 extending through the alternating stack (32, 46), wherein each of the memory stack structures 55 comprises a respective memory film 50 and a respective vertical semiconductor channel 60; drain regions 63 contacting an upper end of a respective one of the vertical semiconductor channels 60; first contact via structures 88A directly contacting a first subset of the drain regions 63 and each having a first horizontal cross-sectional area; and second contact via structures 88B directly contacting a second subset of the drain regions 63 and each having a second horizontal cross-sectional area that is greater than the first horizontal cross-sectional area.

In one embodiment, the first contact via structures 88A and the second contact via structures 88B have a same height.

In one embodiment, the drain regions 63 are arranged in multiple rows; each row of drain regions 63 includes a respective subset of the drain regions 63 that are arranged along a first horizontal direction hd1 with a uniform memory opening pitch mo_p; and the multiple rows of the drain regions 63 are laterally spaced apart from one another along a second horizontal direction hd2 with a uniform inter-row pitch ir_p.

In one embodiment, neighboring rows of drain regions 63 within the multiple rows of drain regions 63 are laterally offset along the first horizontal direction hd1 with respect to each other by one half of the uniform memory opening pitch mo_p; a set of vertical axes VA passing through a geometrical center of a respective one of the first contact via structures 88A are laterally offset along the first horizontal direction hd1 with respect to a set of vertical axes VA passing through a geometrical center of a respective one of the second contact via structures 88B by one half of the uniform memory opening pitch mo_p.

In one embodiment, the first subset of the drain regions 63 comprises a subset of the drain regions 63 located within a first row selected from the multiple rows of drain regions 63; and the second subset of the drain regions 63 comprises a subset of the drain regions 63 located within a second row selected from the multiple rows of the drain regions 63.

The three-dimensional memory device may comprise third contact via structures 88C directly contacting a third subset of the drain regions 63 and each having a third horizontal cross-sectional area that is greater than the second horizontal cross-sectional area.

In one embodiment, each of the first contact via structures 88A has a first circular cylindrical shape with a first radius; each of the second contact via structures 88B has a second circular cylindrical shape with a second radius that is greater than the first radius; and each of the third contact via structures 88C has a third circular cylindrical shape with a third radius that is greater than the second radius.

In one embodiment, the three-dimensional memory device comprises: bit line connection via structures 198 contacting a respective one of the first contact via structures 88A, the second contact via structures 88B, and the third contact via structures 88C; and bit lines 98 contacting a respective subset of the bit line connection via structures 198 and laterally extending along the second horizontal direction hd2 and having a uniform bit line pitch p along the first horizontal direction hd1.

In one embodiment, the uniform memory opening pitch mo_p is an integer multiple of the uniform bit line pitch p.

In one embodiment, the bit line connection via structures 198 are elongated along the second horizontal direction hd2 with a length-to-width ratio in a range from 1.5 to 5; the bit line connection via structures 198 comprise a row of first bit line connection via structures 198A contacting the first contact via structures 88A, a row of second bit line connection via structures 198B contacting the second contact via structures 88B, and a row of third bit line connection via structures 198C contacting the third contact via structures 88C; and the bit line connection via structures 198 have a same length and a same width.

In one embodiment, the row of third bit line connection via structures 198C is laterally offset along the first horizontal direction hd1 from the row of the first bit line connection via structures 198A by the uniform bit line pitch p.

In one embodiment, a first row of second bit line connection via structures 198B (e.g., the second from top row of structures 198B in FIG. 14C) is laterally offset along the first horizontal direction hd1 (e.g., going left to right from the middle row to the second from two row in FIG. 14C) from the row of the first bit line connection via structures 198A by three times the uniform bit line pitch p. A second row of second bit line connection via structures 198B (e.g., the second from bottom row of structures 198B in FIG. 14C) is laterally offset along the first horizontal direction hd1 from the row of the first bit line connection via structures 198A by two times the uniform bit line pitch p.

The first row of second bit line connection via structures 198B (e.g., the second from top row of structures 198B in FIG. 14C) is laterally offset along the first horizontal direction hd1 from a first row of the third bit line connection via structures 198C (e.g., the top row of structures 198C in FIG. 14C) by twice the uniform bit line pitch p along the first horizontal direction hd1 (i.e., going left to right in FIG. 14C from the top row to the second from the top row). The second row of second bit line connection via structures 198B (e.g., the second from bottom row of structures 198B in FIG. 14C) is laterally offset along the first horizontal direction hd1 from a second row of the third bit line connection via structures 198C (e.g., the bottom row of structures 198C in FIG. 14C) by three times the uniform bit line pitch p along the first horizontal direction hd1 (i.e., going left to right in FIG. 14C from the bottom row to the second from the bottom row).

In one embodiment, the first contact via structures 88A, the second contact via structures 88B, and the third contact via structures 88C are arranged in five rows that laterally extend along the first horizontal direction hd1 and laterally spaced apart along the second horizontal direction hd2; and the five rows comprise, from one side to another: a first row of a first subset of the third contact via structures 88C; a second row of a first subset of the second contact via structures 88B; a third row of a set of the first contact via structures 88A; a fourth row of a second subset of the second contact via structures 88B; and a fifth row of a second subset of the third contact via structures 88C.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The silicon substrate may contain an integrated circuit comprising a driver circuit (comprising a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element may be located adjacent to a respective one of the plurality of semiconductor channels (59, 11, 60).

The lateral dimensions of the drain contact via structures (88A, 88B, 88C) may be minimized with the constraint that each overlying bit line connection via structure 198 has a full areal overlap with the underlying drain contact via structure (88A, 88B, 88C). Because of the different lateral offset of the geometrical centers of the first bit line connection via structures 198A, second bit line connection via structures 198B, and the third bit line connection via structures 198C with respect to a respective underlying drain contact via structure (88A, 88B, or 88C), different lateral dimensions may be used for the drain contact via structures (88A, 88B, 88C). By minimizing the lateral dimensions of the drain contact via structures (88A, 88B, 88C) based on different requirements for areal overlap with an overlying bit line connection via structure 198, capacitive coupling between the drain contact via structures (88A, 88B, 88C) may be minimized, and the RC delay for the bit lines 98 may be minimized.

Various embodiments disclosed herein provide a different approach for contact to memory hole size, location, and/or shape. Various embodiments disclose progressive size of contact via structures, depending on the enclosing contact via structure location. The various embodiments help reduce bit line capacitance, improves uniformity of bit line capacitance across rows, and preserves the circular shape of contact via structures for ease of lithography as compared to elliptical shape contacts. Moreover, the embodiments help to keep the contact to memory hole aligned with the center of the memory hole during processing.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   memory stack structures extending through the alternating stack, wherein each of the memory stack structures comprises a respective memory film and a respective vertical semiconductor channel;
   drain regions contacting an upper end of a respective one of the vertical semiconductor channels;
   first contact via structures directly contacting a first subset of the drain regions and each having a top surface having a first horizontal cross-sectional area; and
   second contact via structures directly contacting a second subset of the drain regions and each having a top surface having second horizontal cross-sectional area that is greater than the first horizontal cross-sectional area,
   wherein each of the first contact via structures directly contacts only one respective drain region, wherein the only one respective drain region directly contacted by each of the first contact via structures is located in the first subset of the drain regions and each of the second contact via structures directly contacts only one respective drain region, wherein the only one respective drain region directly contacted by each of the second contact via structures is located in the second subset of the drain regions.

2. The three-dimensional memory device of claim 1, wherein the first contact via structures and the second contact via structures have a same height.

3. The three-dimensional memory device of claim 1, wherein:
   the drain regions are arranged in multiple rows;
   each row of drain regions includes a respective subset of the drain regions that are arranged along a first horizontal direction with a uniform memory opening pitch; and
   the multiple rows of the drain regions are laterally spaced apart from one another along a second horizontal direction with a uniform inter-row pitch.

4. The three-dimensional memory device of claim 3, wherein:
   neighboring rows of drain regions within the multiple rows of drain regions are laterally offset along the first horizontal direction with respect to each other by one half of the uniform memory opening pitch;
   a set of vertical axes passing through a geometrical center of a respective one of the first contact via structures are laterally offset along the first horizontal direction with respect to a set of vertical axes passing through a geometrical center of a respective one of the second contact via structures by one half of the uniform memory opening pitch.

5. The three-dimensional memory device of claim 3, wherein:
   the first subset of the drain regions comprises a subset of the drain regions located within a first row selected from the multiple rows of drain regions; and
   the second subset of the drain regions comprises a subset of the drain regions located within a second row selected from the multiple rows of the drain regions.

6. The three-dimensional memory device of claim 5, further comprising third contact via structures directly contacting a third subset of the drain regions and each having a third horizontal cross-sectional area that is greater than the second horizontal cross-sectional area.

7. The three-dimensional memory device of claim 6, wherein:
   each of the first contact via structures has a first circular cylindrical shape with a first radius;
   each of the second contact via structures has a second circular cylindrical shape with a second radius that is greater than the first radius; and
   each of the third contact via structures has a third circular cylindrical shape with a third radius that is greater than the second radius.

8. The three-dimensional memory device of claim 6, further comprising:
   bit line connection via structures contacting a respective one of the first contact via structures, the second contact via structures, and the third contact via structures; and
   bit lines contacting a respective subset of the bit line connection via structures and laterally extending along the second horizontal direction and having a uniform bit line pitch along the first horizontal direction.

9. The three-dimensional memory device of claim 8, wherein the uniform memory opening pitch is an integer multiple of the uniform bit line pitch.

10. The three-dimensional memory device of claim 8, wherein:
- the bit line connection via structures are elongated along the second horizontal direction with a length-to-width ratio in a range from 1.5 to 5;
- the bit line connection via structures comprise a row of first bit line connection via structures contacting the first contact via structures, a row of second bit line connection via structures contacting the second contact via structures, and a row of third bit line connection via structures contacting the third contact via structures; and
- the bit line connection via structures have a same length and a same width.

11. The three-dimensional memory device of claim 10, wherein the row of third bit line connection via structures is laterally offset along the first horizontal direction from the row of the first bit line connection via structures by the uniform bit line pitch.

12. The three-dimensional memory device of claim 11, wherein:
- the row of second bit line connection via structures is laterally offset along the first horizontal direction from the row of the first bit line connection via structures by two or three times the uniform bit line pitch; and
- the row of second bit line connection via structures is laterally offset along the first horizontal direction from the row of the third bit line connection via structures by another one of the two or three times the uniform bit line pitch.

13. The three-dimensional memory device of claim 8, wherein:
- the first contact via structures, the second contact via structures, and the third contact via structures are arranged in five rows that laterally extend along the first horizontal direction and laterally spaced apart along the second horizontal direction; and
- the five rows comprise, from one side to another:
- a first row of a first subset of the third contact via structures;
- a second row of a first subset of the second contact via structures;
- a third row of a set of the first contact via structures;
- a fourth row of a second subset of the second contact via structures; and
- a fifth row of a second subset of the third contact via structures.

14. The three-dimensional memory device of claim 1, wherein:
- each of the first contact via structures has a first cylindrical shape with a circular cross section having a first radius; and
- each of the second contact via structures has a second cylindrical shape with a circular cross section having a second radius that is greater than the first radius.

15. The three-dimensional memory device of claim 14, further comprising third contact via structures directly contacting a third subset of the drain regions and each having a third horizontal cross-sectional area that is greater than the second horizontal cross-sectional area, wherein each of the third contact via structures has a third cylindrical shape with a circular cross section having a third radius that is greater than the second radius.

16. The three-dimensional memory device of claim 15, further comprising an insulating spacer having a sidewall that contacts each layer within the alternating stack and not in direct contact with any of the first contact via structures, the second contact via structures, and the third contact via structures.

17. The three-dimensional memory device of claim 1, further comprising:
- a contact level dielectric layer laterally surrounding each of the first contact via structures and the second contact via structures; and
- a backside contact via structure vertically extending through each layer within the alternating stack and having a top surface within a horizontal plane including a top surface of the contact level dielectric layer.

18. The three-dimensional memory device of claim 17, further comprising an insulating spacer laterally surrounding the backside contact via structure and having a top surface within the horizontal plane including the top surface of the contact level dielectric layer.

19. The three-dimensional memory device of claim 18, wherein a sidewall of the insulating spacer contacts a sidewall of the contact level dielectric layer.

20. The three-dimensional memory device of claim 1, wherein each of the first contact via structures and the second contact via structures has a respective substantially circular horizontal cross-sectional shape.

\* \* \* \* \*